US006180958B1

(12) United States Patent
Cooper, Jr.

(10) Patent No.: US 6,180,958 B1
(45) Date of Patent: *Jan. 30, 2001

(54) STRUCTURE FOR INCREASING THE MAXIMUM VOLTAGE OF SILICON CARBIDE POWER TRANSISTORS

(76) Inventor: James Albert Cooper, Jr., 511 Kerber Rd., West Lafayette, IN (US) 47906

(*) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/797,535

(22) Filed: Feb. 7, 1997

(51) Int. Cl.[7] .................................................... H01L 29/76
(52) U.S. Cl. .............................. 257/77; 257/330; 257/329
(58) Field of Search ................................. 257/77, 328–331

(56) References Cited

U.S. PATENT DOCUMENTS

| 4,587,712 | * | 5/1986 | Baliga | 257/264 |
|---|---|---|---|---|
| 4,941,026 | | 7/1990 | Temple. | |
| 5,168,331 | | 12/1992 | Yilmaz. | |
| 5,233,215 | | 8/1993 | Baliga. | |
| 5,250,450 | * | 10/1993 | Lee et al. | 257/327 |
| 5,336,904 | * | 8/1994 | Kusunoki | 257/24 |
| 5,393,999 | | 2/1995 | Malhi. | |
| 5,396,085 | * | 3/1995 | Baliga | 257/77 |
| 5,397,717 | | 3/1995 | Davis et al.. | |
| 5,399,515 | | 3/1995 | Davis et al.. | |
| 5,448,081 | | 9/1995 | Malhi. | |
| 5,451,797 | | 9/1995 | Davis et al.. | |
| 5,459,107 | | 10/1995 | Palmour. | |
| 5,471,075 | | 11/1995 | Shekar et al.. | |
| 5,486,484 | | 1/1996 | Malhi. | |
| 5,488,236 | | 1/1996 | Baliga et al.. | |
| 5,506,421 | | 4/1996 | Palmour. | |
| 5,514,604 | | 5/1996 | Brown. | |
| 5,574,295 | | 11/1996 | Kurtz et al.. | |
| 5,612,232 | * | 3/1997 | Thero et al. | 438/571 |
| 5,744,826 | * | 4/1998 | Takeuchi et al. | 257/328 |
| 5,747,831 | * | 5/1998 | Loose et al. | 257/77 |
| 5,763,902 | * | 6/1998 | Harris et al. | 257/77 |
| 5,831,288 | * | 11/1998 | Singh et al. | 257/77 |
| 5,900,648 | * | 5/1999 | Harris et al. | 257/77 |

FOREIGN PATENT DOCUMENTS

| 0345380 | 12/1989 | (EP). |
|---|---|---|
| 0 676 814 | 3/1995 | (EP). |
| 94/13017 | 6/1994 | (WO). |

OTHER PUBLICATIONS

Constapel, R., et al.; "Trench–IGBTS with Integrated Diverter Structures"; Proceedings of the 7th International Symposium on Power Semiconductor Devices and IC'S. (ISPSD), Yokahama, May 23–25, 1995, No. Symp. 7, May 23, 1995, Institute of Electrical and Electronic Engineers, pp. 201–206, XP000594258.

Ramungul, N.; "Design and Simulation of 6H–SiC UMOS FET and IGBT for High–Temperature Power Electronics Applications"; Inst. Phys. Conf. Ser. No. 142: Chapter 4, Proceedings of International Conference on Silicon Carbide and Related Materials, Sep. 18–21, 1995; Kyoto, Japan; pp. 773–776, XP002063000.

Baliga, B. J.; "Trends in Power Semiconductor Devices"; IEEE Transactions on Electron Devices, vol. 43, No. 10, Oct. 1996, pp. 1717–1731, XP000626907.

Baliga, B. J.; "Critical Nature of Oxide/Interface Quality for SiC Power Devices"; Microelectronic Engineering, vol. 28, No. 1/04, Jun. 1, 1995, pp. 177–184, XP000513457.

* cited by examiner

Primary Examiner—Tom Thomas
Assistant Examiner—Ori Nadav
(74) Attorney, Agent, or Firm—Philip Summa, P.A.

(57) ABSTRACT

A silicon carbide insulated gate power transistor is disclosed that demonstrates increased maximum voltage. The transistor comprises a field effect or insulated gate transistor with a protective region adjacent the insulated gate that has the opposite conductivity type from the source for protecting the gate insulator material from the degrading or breakdown effects of a large voltage applied across the device.

31 Claims, 18 Drawing Sheets

STRUCTURE FOR INCREASING THE MAXIMUM VOLTAGE OF SILICON CARBIDE POWER TRANSISTORS

FIELD OF THE INVENTION

The present invention relates to insulated gate power semiconductor devices and in particular relates to UMOS and IGBT field effect transistors formed in silicon carbide.

BACKGROUND OF THE INVENTION

The present invention relates to power semiconductor devices and particularly power MOSFETs (metal-oxide-semiconductor field-effect transistors) formed in silicon carbide. A power MOSFET is a small, reliable, electronically controllable switching device that has growing application in high voltage/high power devices and integrated circuits. Power MOSFETs have a variety of applications in numerous fields including communications, consumer applications, data processing, military, industrial, automotive and related markets. In particular, power MOSFETs have inherently higher switching speeds than bipolar transistors and are accordingly particularly useful in high frequency applications.

Although silicon has been the material of choice for many semiconductor applications, its fundamental electronic structure and characteristics prevent its utilization beyond certain parameters. Thus, interest for power MOSFET devices has turned from silicon to other materials, including silicon carbide.

Silicon carbide has a number of intrinsic advantages for power MOSFET applications. Silicon carbide has a high field saturation velocity which is three times larger than that of gallium arsenide (GaAs). Silicon carbide has a high intrinsic breakdown field ten times higher than gallium arsenide and a thermal conductivity ten times as high as gallium arsenide.

SiC is unique among compound semiconductors in that its native oxide is $SiO_2$, the same oxide as silicon. This means that the workhorse power devices used in silicon, i.e. the power MOSFET, insulated gate bipolar transistor (IGBT), and MOS-controlled thyristor (MCT) can all be fabricated in SiC. Because of technological differences, however, power devices in SiC can be very different from silicon devices, and a direct translation of silicon concepts to SiC is not always possible. SiC has a breakdown field eight times higher than silicon, and SiC power devices can have specific on-resistances 100 to 200 times lower than similar devices in silicon. Nevertheless, several practical problems must be addressed before such devices can be realized. Bipolar devices in SiC (e.g., the IGBT and MCT) suffer from short minority carrier lifetimes, which are typically in the range of 40 to 400 nanoseconds (ns). As a result, the highest current gains yet reported in SiC bipolar transistors are in the range of 10 to 12.

Because the peak electric field can be eight times (8×) higher than in silicon, SiC switching devices can be fabricated with a drift region about 8× thinner than comparable silicon devices. If the drift region is 8× thinner, the doping of the drift region can be about twelve times (12×) higher. The resistance of the drift region is proportional to the thickness and inversely proportional to the doping, so the specific on-resistance of a SiC device can be from 100–200 times smaller than a comparable silicon device of equal voltage rating. This means the SiC device can be 100–200 times smaller than the comparable silicon device. Alternatively, if the SiC device has the same area as the comparable silicon device, its specific on-resistance will be 100–200 times lower.

Although it offers substantial advantages over silicon, SiC is still relatively immature as a semiconductor material. Single crystal wafers of SiC have only been commercially available since 1991, and a number of technical problems need to be addressed before SiC can supplant silicon in power device applications. The main problems are related to crystal growth of SiC materials. Because of the very high melting point, single crystal boules cannot be pulled from a melt as in the Czochralski method used for silicon. Instead, the boule is grown on a seed crystal by a high temperature sublimation process. At present, the boules grown by the sublimation process are about 2 inches in diameter, much smaller than the 6 to 8 inches common in the silicon industry. In addition, the material still has a relatively large number of defects. These defects include micropipes; i.e. micron-size holes which run completely through the wafer. Fortunately, the micropipe problem appears to be under control, with micropipe densities as low as 27 $cm^{-2}$ in the most recent wafers, and at the current rate of improvement micropipes should eventually be completely eliminated.

SiC crystallizes in the hexagonal lattice with alternating planes of silicon and carbon atoms. The Si—C plane-pairs can occur in three orientations, labeled A, B, and C. The particular stacking sequence of Si—C plane-pairs identifies the polytype of the crystal. SiC occurs in a variety of polytypes, but the most common are 3C, 4H, and 6H. At the present time, the 6H polytype is the most thoroughly characterized, but the 4H polytype is more attractive for power devices because of its higher electron mobility.

Although it has a much higher breakdown field than silicon, SiC has lower hole and electron mobilities and shorter minority carrier lifetimes. The shorter lifetimes allow bipolar devices in SiC to switch much faster than comparable silicon devices, but they limit the current gain of SiC bipolar transistors to very low values, typically less than 20. For high-speed switching with low forward voltage drop, the best SiC device will be a power MOSFET.

The typical power MOSFET in silicon is a DMOS (or doubly-diffused MOS) structure. The short channel length is achieved by diffusing the p-type base layer and the n+ source through the same oxide window, thus removing any dependence on alignment of photomasks. The p-type base must have a sufficient number of dopant atoms per unit area (thickness times concentration) to prevent punch-through by the drain electric field in the blocking state. Unfortunately, the DMOS concept is difficult to translate to SiC because it is not feasible to thermally diffuse dopant atoms in SiC. One might artificially construct a similar structure using ion implantation, but the channel length would then be defined by a mask alignment, and it would be difficult to implant the p-type impurity to sufficient depth to prevent punch-through. For these reasons, a vertical UMOSFET structure—i.e. a combination of SiC epitaxial layers and a trench—is the most practical in SiC.

The theoretical potential for SiC MOSFETs has not been reached, however, because the maximum voltage in silicon carbide MOSFETs is instead limited by the breakdown field of the silicon dioxide ($SiO_2$) insulator. Although this oxide does not actually fail until fields of about $10^7$ volts per centimeter (V/cm) are reached, from a practical standpoint the low-term reliability of the oxide degrades severely under fields above about $2-3\times10^6$ V/cm. Such a field limitation is already slightly lower than the breakdown field of silicon carbide. Even more problematic, however, because of the 2.5:1 ratio of the dielectric constants of silicon dioxide and silicon carbide, Gauss' law requires that the maximum field in the silicon carbide portion of a device be limited to around $1 \times 10^6$ V/cm. As a result, silicon carbide power transistors are in practical terms limited to a blocking voltage much lower than that of which silicon carbide is theoretically capable.

Accordingly, the need exists for power transistors, particularly power MOSFETs, in silicon carbide that are capable of taking greater advantage of silicon carbide's favorable intrinsic properties, and it is an object of the invention to provide such transistors.

SUMMARY OF THE INVENTION

The invention meets this object with a silicon carbide insulated gate power transistor that demonstrates increased maximum voltage. The transistor comprises an opposite conductivity-type region adjacent the insulated gate for protecting the gate insulator material from the degrading or breakdown effects of a large voltage applied across the device.

In another aspect, the invention is a method of making a silicon carbide power transistor that demonstrates such increased maximum voltage. The method comprises etching a first-opposite-first conductivity-type silicon carbide structure to define a trench, and implanting an opposite layer at the bottom of the trench that is aligned by the trench walls. Adding the appropriate oxidation layer and ohmic contacts produces the improved transistor of the present invention.

BRIEF DESCRIPTION OF THE DRAWINGS

The foregoing and other objects, features, and advantages of the present invention will be made apparent from the following detailed description of the preferred embodiment of the invention and from the drawings, in which.

DETAILED DESCRIPTION OF THE PREFERRED EMBODIMENTS

In its broadest sense, the invention is an insulated gate transistor, field-effect or bipolar, in which the gate material is an oxide, and in which the opposite conductivity semiconductor is placed adjacent the oxide to protect the oxide from high electric fields.

Figure 1:
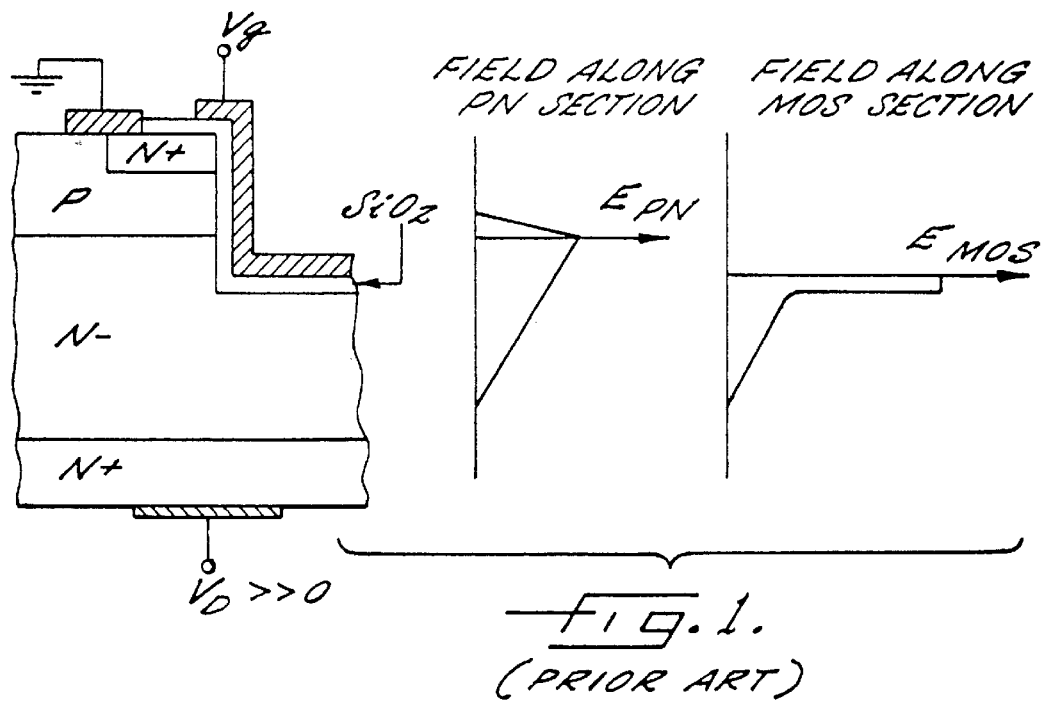
FIG. 1 is a cross-sectional schematic diagram of a UMOS according to the prior art accompanied by informal plots of the field along the p-n and MOS sections of such prior art devices.
Figure 2:
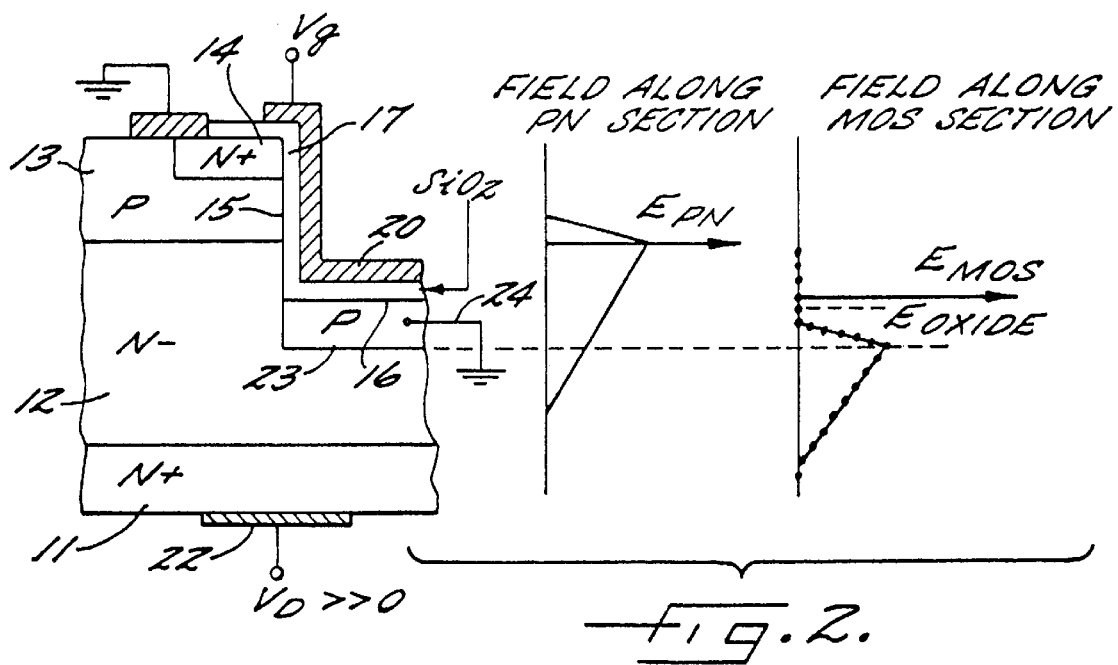
FIG. 2 is a similar schematic cross-sectional view of a UMOS according to the present invention and again accompanied by informal plots of the resulting field along the p-n and MOS sections of the device.

The preferred embodiment of the invention is a silicon carbide UMOS power transistor broadly designated at 10 in FIG. 2. For comparison purposes, a prior art device is illustrated in FIG. 1. In a presently preferred embodiment, the UMOS 10 is formed of an n-type single-crystal silicon carbide substrate 11, an n-type silicon carbide epitaxial layer 12 on the n-type substrate 11 and a p-type epitaxial layer 13 on the n-type epitaxial layer 12. An n-type well 14 is formed in the p-type epitaxial layer 13. A gate trench defined by the trench wall 15 and a flat trench bottom 16 extends through the n-type well 14 and the p-type epitaxial layer 13 and terminates in the n-type epitaxial layer 12. A gate oxide 17 covers the wall 15 and bottom 16 of the trench.

Respective ohmic contacts define the source, gate, and drain. In particular, the gate contact 20 is on the oxide layer 17, the source contact 21 is on the p-type epitaxial layer 13 and overlaps with the n-type well 14, and the drain contact 22 is made to the n-type substrate 11 so that the three contacts define the source, gate and drain of the UMOS 10. There are a number of metals and composite metal systems that are appropriate for these contacts, and as these are generally well understood in the art, they will not be described in detail further herein other than to note that, for example, nickel or nickel-titanium combinations are appropriate ohmic contacts to n-type silicon carbide while aluminum or aluminum-titanium combinations are useful ohmic contacts to p-type silicon carbide. More recently cobalt silicide ($CoSi_2$) has shown promise as an ohmic contact material to p-type silicon carbide.

As noted in the background portion, within the last decade, silicon carbide substrates, and substrates that include appropriate epitaxial layers, have become commercially available. Thus, their formation and growth will not be discussed in detail herein, other than to note that exemplary substrate and epitaxial growth techniques are set forth in U.S. Pat. Nos. 4,912,063; 4,912,064; Re. 34,861; and 5,011, 549. Similarly, the oxide layer 17 can be a deposited or a thermal oxide, and some advantageous methods of forming high quality silicon dioxide layers on silicon carbide are set forth in U.S. Pat. No. 5,459,107 and in copending application Ser. No. 08/554,319 filed Nov. 8, 1995 for, "Process for Reducing Defects in Oxide Layers on SiC." Appropriate ohmic contact structures are set forth for example in U.S. Pat. Nos. 5,323,022 and 5,409,859.

As FIG. 2 indicates, in the preferred embodiment the n-type substrate 11 is somewhat more heavily doped than the n-type epitaxial layer 12 with appropriate doping concentrations being for example $2 \times 10^{19}$ $cm^{-3}$ for the substrate 11 and $2 \times 10^{16}$ $cm^{-3}$ for the n⁻ epitaxial layer 12. It will be understood that the use of an n⁻ epilayer on an n⁺ substrate offers certain advantages for current flow in particular situations. In other embodiments, a single n-type layer or substrate provides an appropriate drain structure.

Similarly, the n-type well 14 is more heavily doped, comparatively speaking than either the p-type epitaxial layer 13 or the n-type epitaxial layer 12. An exemplary doping level for the n-type well 14 is also $2 \times 10^{19}$ cm$^{-3}$, and for the p-type layer 13 is $5 \times 10^{17}$ cm$^{-3}$.

The invention further comprises a grounded p-type protective region 23 between the oxide 17 and the n-type epitaxial layer 12, and which, in the embodiment illustrated in FIG. 2, is under the bottom portion of the trench oxide 17. The p-type protective region 23 is grounded by the ohmic contact shown schematically at 24 in FIG. 2. This ohmic contact is typically formed on the horizontal surface 16 at a location not covered by the gate metal and gate oxide, for example at a point on a plane behind the view of FIG. 2. The p-type region 23 is aligned with the bottom 16 of the gate trench for protecting the oxide 17 in the trench from the degrading or breakdown effects of a large positive voltage applied to the drain contact 22.

Stated independently of specific polarity, the opposite-type protective region (23 in FIG. 2) is adjacent the insulated gate (silicon dioxide 20 in FIG. 2) and protects the gate insulator material 20 from the degrading or breakdown effects of a large voltage applied to the drain.

The results of this structure are informally illustrated by comparing the field strength plots of FIG. 1 with those of FIG. 2, and are more formally illustrated by the information presented in FIGS. 3–18. In both FIG. 1 and FIG. 2, the field strength along the p-n section is basically the same. The effect of adding the p-layer 23 of the present invention, however, is illustrated by the difference between the field along the MOS section plotted in FIG. 1 versus that plotted in FIG. 2. As FIG. 2 illustrates, the invention keeps the peak field strength away from the oxide so that a high voltage applied to the drain (as indicated by $V_d \gg 0$ in FIG. 2), does not affect the oxide layer 17 in the UMOS 10 of FIG. 2 in the same way that a similarly high drain voltage affects the oxide layer in the prior art example of FIG. 1. By essentially protecting the oxide layer 17 from the field created by the high voltage, the p-type layer 23 permits the performance of the silicon carbide device of the present invention to more closely approach its theoretical potential.

In order to obtain a more formal indication of the performance of the device, the design illustrated in FIG. 2 was analyzed using the MEDICI™ device stimulation program. MEDICI™, which is one of a number of commercially available device-simulation programs, was used to find the e-field value of each point inside the different SiC UMOS devices with the different biases. From this the maximum bias for each UMOS could be determined with the maximum e-field in the oxide 17 lower than or equal to $3 \times 10^6$ V/cm. For analytical purposes, this was defined as the maximum bias voltage for the device.

The MEDICI™ program is available from TMA, 595 Lawrence Expressway, Sunnydale, Calif. 94087 (URL: http://www.tmai.com). MEDICI™ predicts the electrical characteristics of arbitrary two-dimensional structures under user-specified operating conditions. The analysis of MOS-FETs is one of the typical device applications for which the MEDICI™ simulation program is useful.

The MEDICI™ results are illustrated in FIGS. 3–18. FIGS. 3–6 describe a conventional prior art UMOS, while FIGS. 7–18 describe a UMOS according to the present invention.

Figure 3:
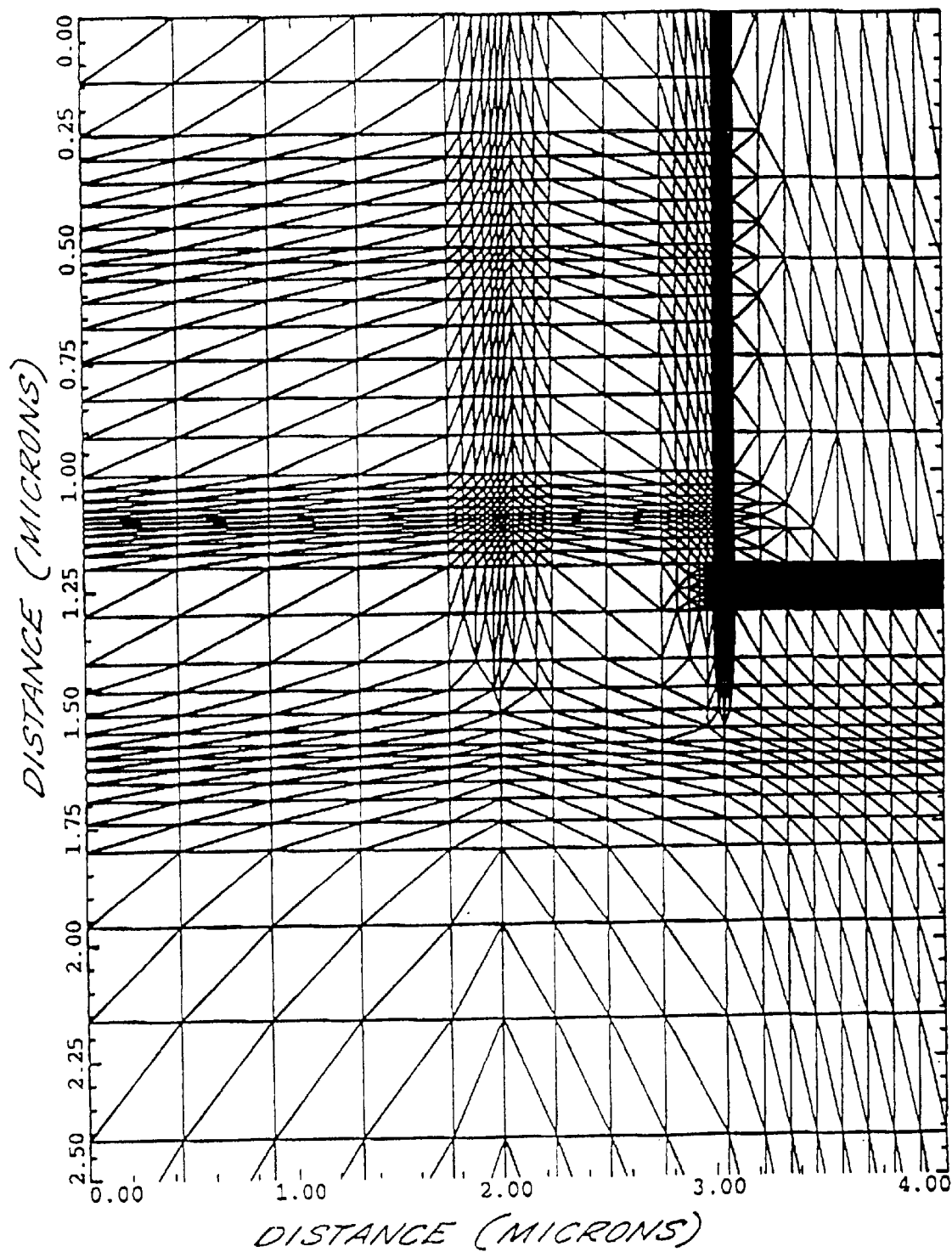
FIG. 3 is a user defined grid of a conventional prior art UMOS using device simulation software.

FIG. 3 is a user-defined grid for a conventional UMOS power device such as the one illustrated in FIG. 1. Using the MEDICI™ program, the number and location of the grid points were selected to define the desired device in a two-dimensional pattern. Typically, and as FIG. 3 illustrates, a larger number of grid points are selected and assigned to those portions of the device that will demonstrate the greatest effects or responses to voltage, current, and electric field. For example, in FIG. 3, a large number of grid points are assigned to the oxide and appear as the dark L-shaped wide lines. As the listed dimensions indicate, FIG. 3 illustrates a cross-sectional portion of a conventional UMOS that is approximately 4 microns wide and 2½ microns high.

Figure 4:
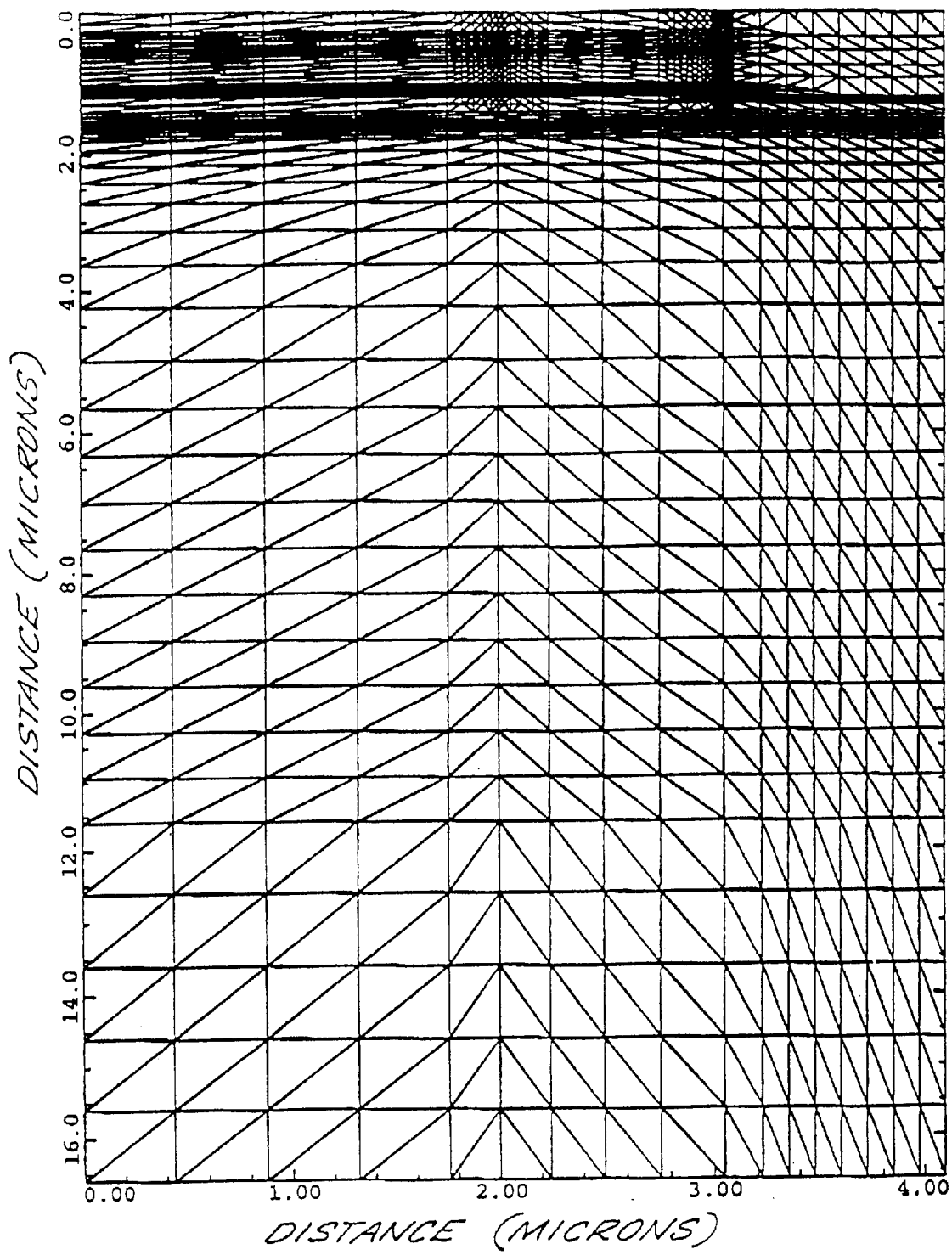
FIG. 4 is a grid similar to FIG. 3, but expanded in the vertical direction.

FIG. 4 is based upon the identical data as FIG. 3 except that FIG. 4 is expressed along a vertical distance of approximately 16 microns.

Figure 5:
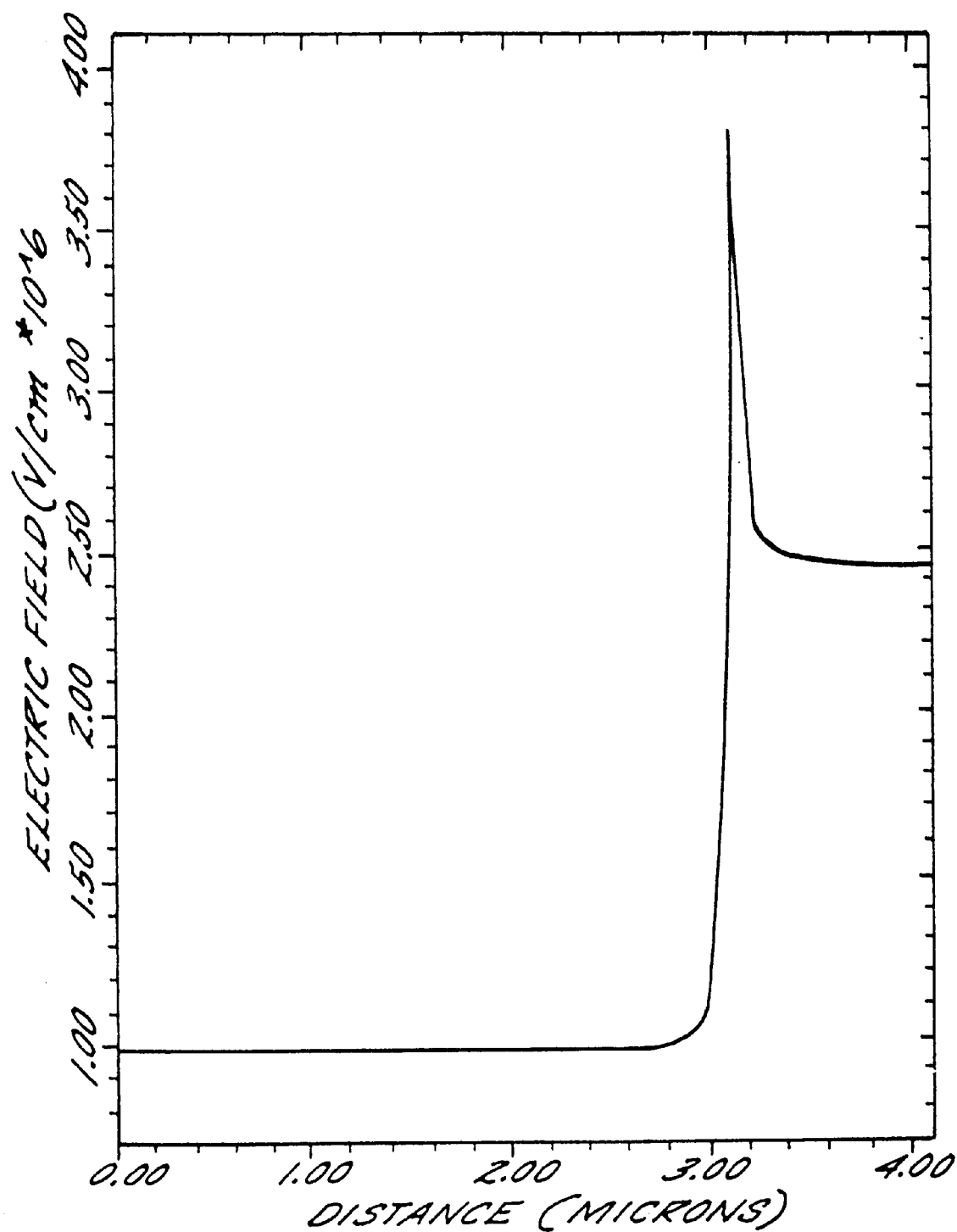
FIGS. 5 and 6 are plots of the electric field strength at various positions within a conventional prior art UMOS based on the grids of FIGS. 3 and 4.

FIG. 5 demonstrates the behavior of a conventional SiC UMOS as modeled by the MEDICI™ program. The plot of FIG. 5 is taken along the line y=1.2033 microns; i.e. a horizontal line between the left and right hand borders of FIG. 3. As FIG. 3 illustrates, such a horizontal line passes through the oxide portion at the bottom of the UMOS trench.

In particular, FIG. 5 models the behavior of the conventional UMOS at a drain voltage of 150 volts. Under such conditions, the peak electric field is approximately $3.82 \times 10^6$ V/cm and occurs along the horizontal line at an x coordinate of about 3.08 microns. Again returning to FIG. 3, this corresponds to the corner of the oxide, which is generally the expected position for the highest field strength. As noted above, such a high field strength can cause the oxide to either breakdown immediately, or to degrade so rapidly as to render the device generally useless under such conditions. As also noted earlier, in order to avoid oxide degradation, the peak electric field in the oxide should desirably be kept below about $2.5-3 \times 10^6$ V/cm, and preferably even lower.

Figure 6:
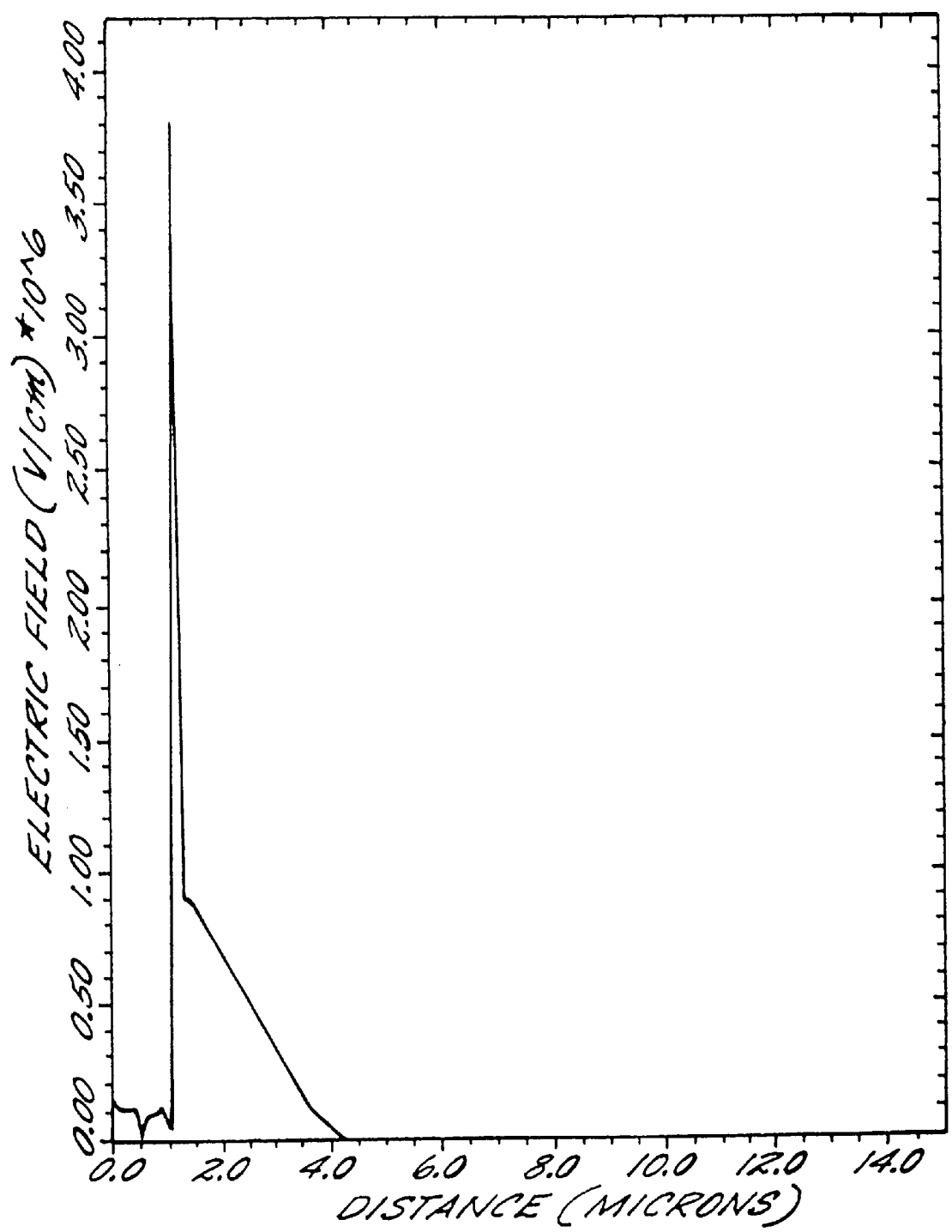

FIG. 6 illustrates the same information as FIG. 5, but does so by measuring the field along a vertical line defined by an x coordinate of 3.0967 microns, and again with an applied drain voltage of 150 volts. As FIG. 6 demonstrates, the peak value of the electric field is again about $3.82 \times 10^6$ V/cm and occurs at the corner of the oxide; i.e. a coordinate defined by x=3.1 microns and y=1.25 microns.

Figure 7:
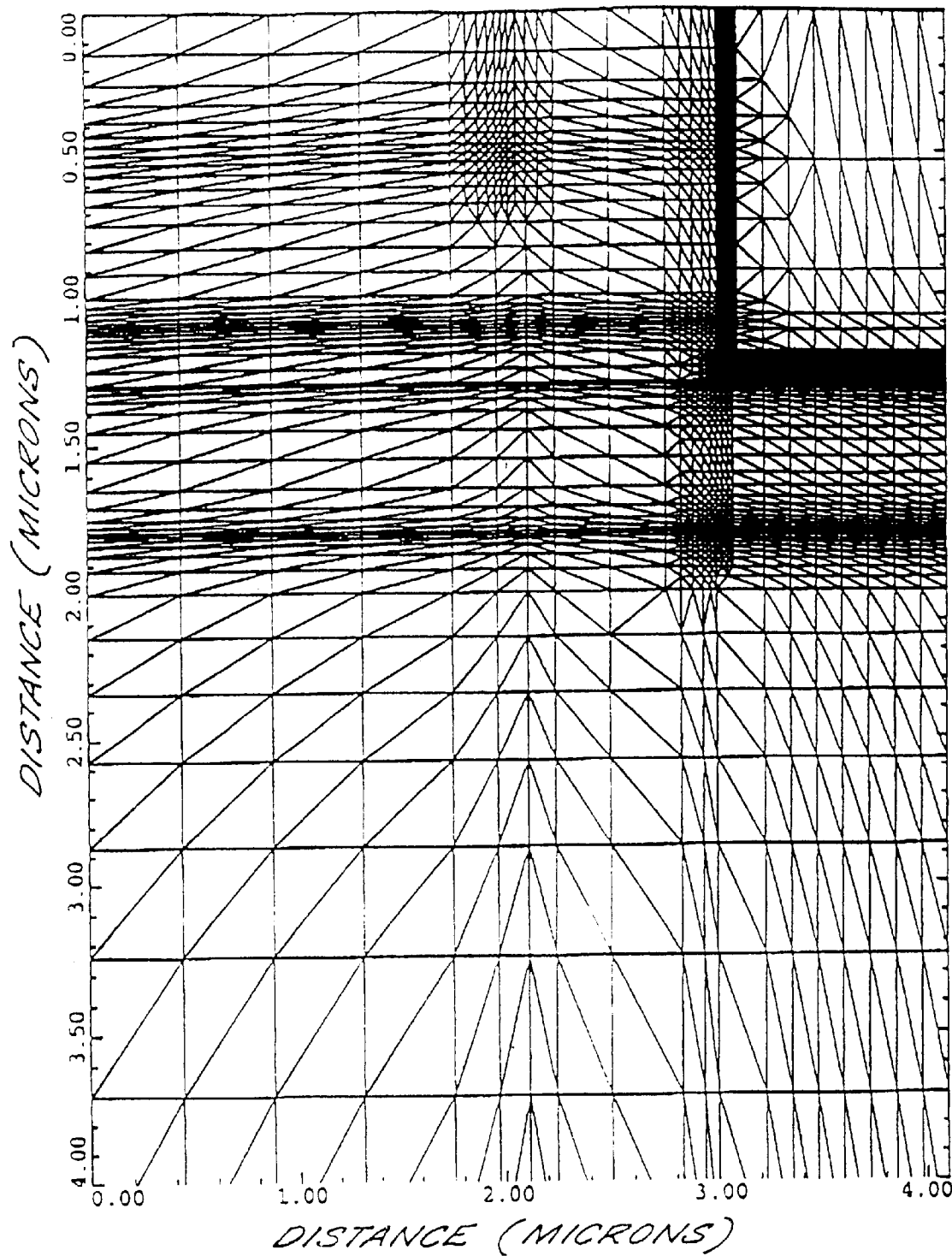
FIGS. 7 and 8 are user-defined grids for the UMOS of the present invention based on a 4 micron and a 16 micron vertical cross-section, respectively.

FIG. 7 is the user defined MEDICI™ grid for the UMOS of the present invention with the implanted p-layer (e.g. illustrated at 23 in FIG. 2) having a depth of about 0.5 microns. In a manner similar to FIG. 3, the largest number of points in the grid are selected within the oxide portion, which again appears as the large L-shaped solid lines in FIG. 7. FIG. 7 also includes, however, a large number of grid points corresponding to the implanted p-layer just below the oxide. As with FIG. 3, the cross-sectional grid of FIG. 7 covers approximately 4 microns vertically and 4 microns horizontally.

Figure 8:
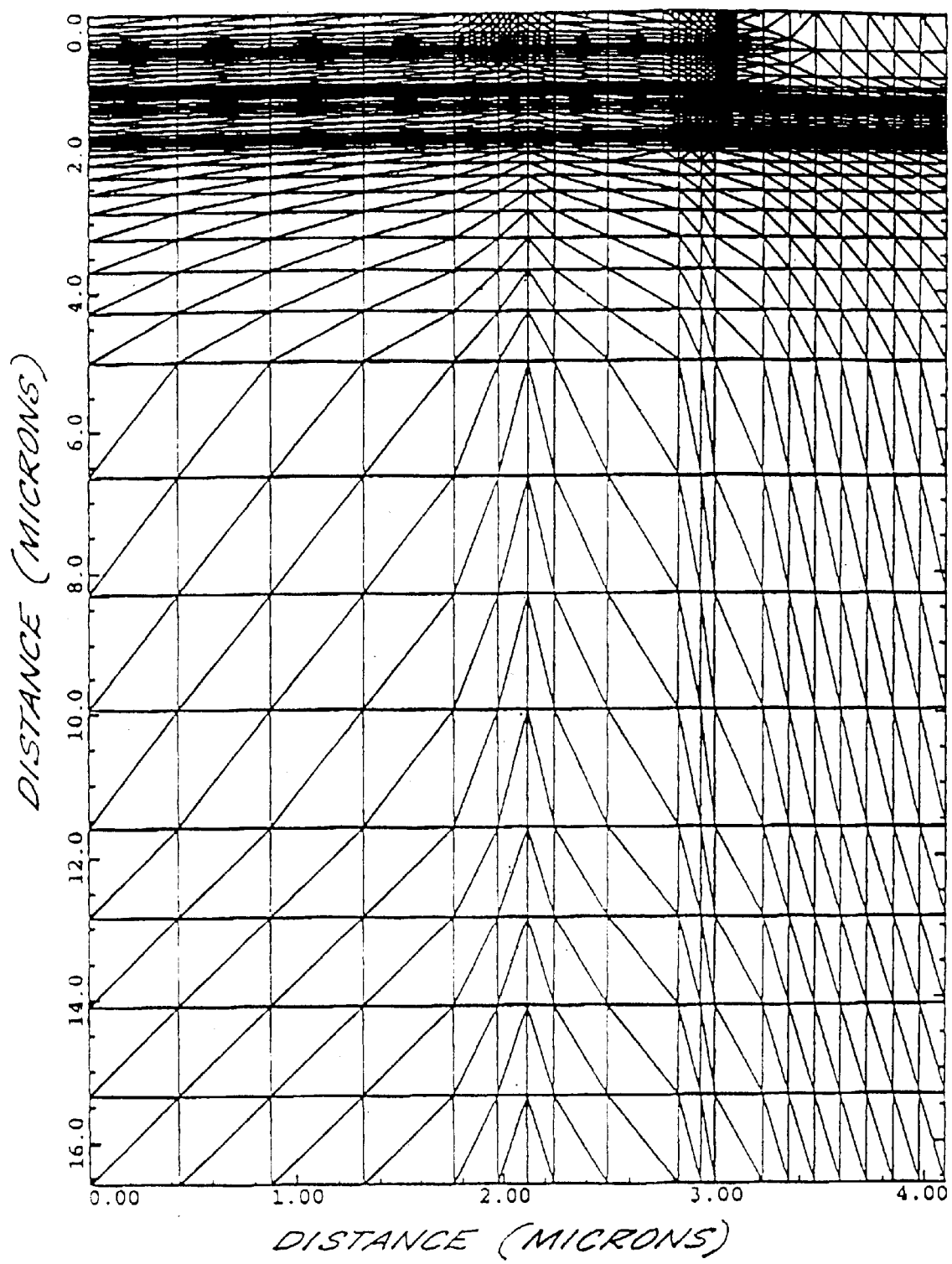

FIG. 8 corresponds to the same structure as does FIG. 7, but is plotted to show a depth of 16 microns.

Figure 9:
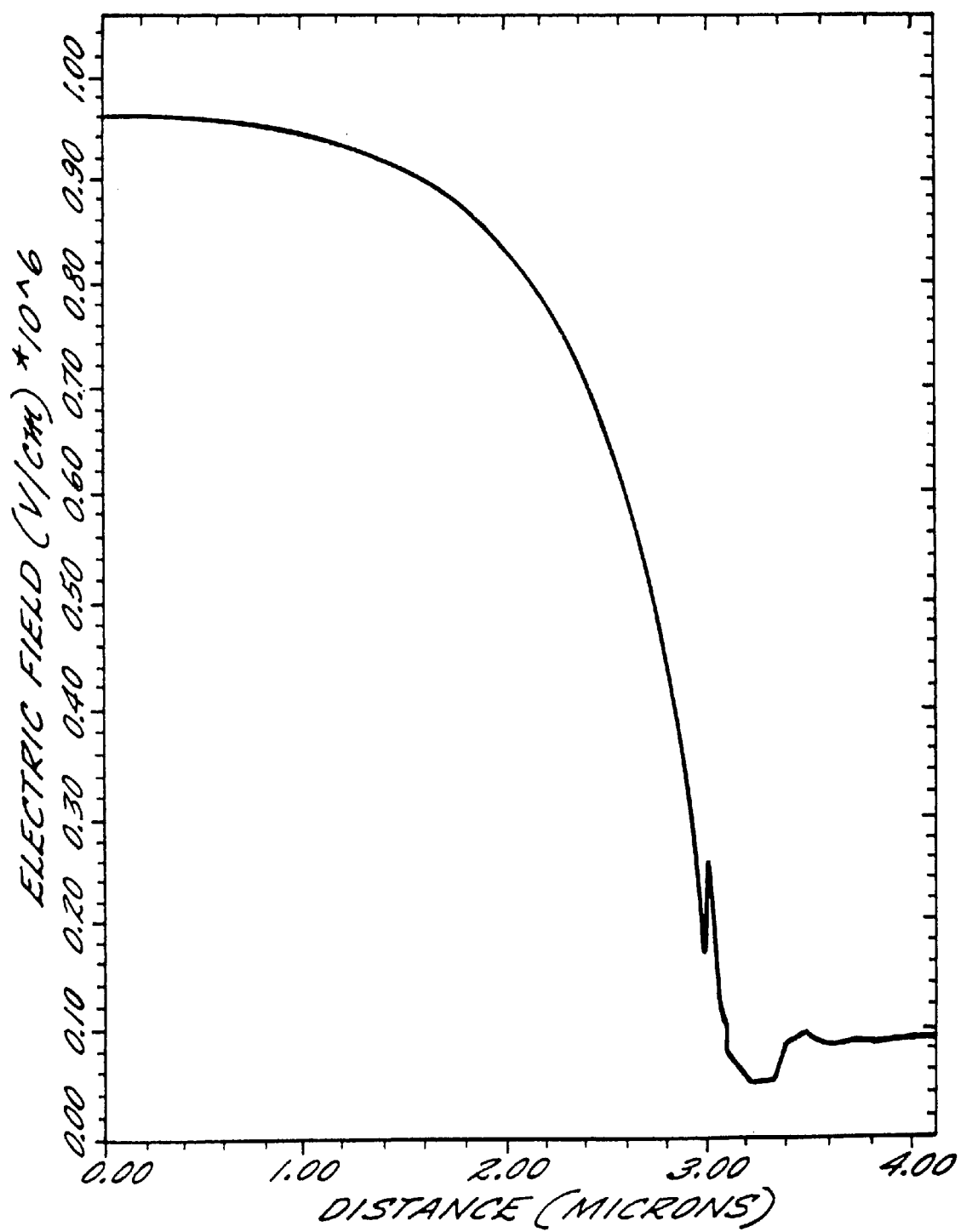
FIGS. 9 and 10 are plots of the electric field strength at various positions within the UMOS of the present invention as defined in FIGS. 7 and 8.

FIG. 9 shows the behavior predicted by the MEDICI™ program for the UMOS according to the present invention under an applied drain voltage of 150 volts, and doping concentrations of $2.0 \times 10^{16}$ cm$^{-3}$ ("2E16") in the n$^-$ layer (e.g. 12 in FIG. 7), $2 \times 10^{19}$ cm$^{-3}$ in the substrate 11, and $5 \times 10^{17}$ cm$^{-3}$ in both the p-type epilayer 13 and in the grounded p-type region 23. FIG. 9 is taken along a horizontal line again defined by y=1.2023 microns; i.e. the same horizontal line as FIG. 5. Thus, FIGS. 5 and 9 provide a basis for comparison of the two devices at a structurally equivalent point. As FIG. 9 demonstrates, a peak in the electric field still occurs at the corner of the oxide (x=3 microns, y=1.2 microns), but also demonstrates that the electric field at that point has been greatly reduced; i.e. about $0.278 \times 10^6$ V/cm; i.e. more than an order of magnitude lower than the electric field at the oxide corner without the implanted p-layer (as compared to the field of $3.82 \times 10^6$ V/cm at the same point in FIGS. 5 and 6).

Figure 10:
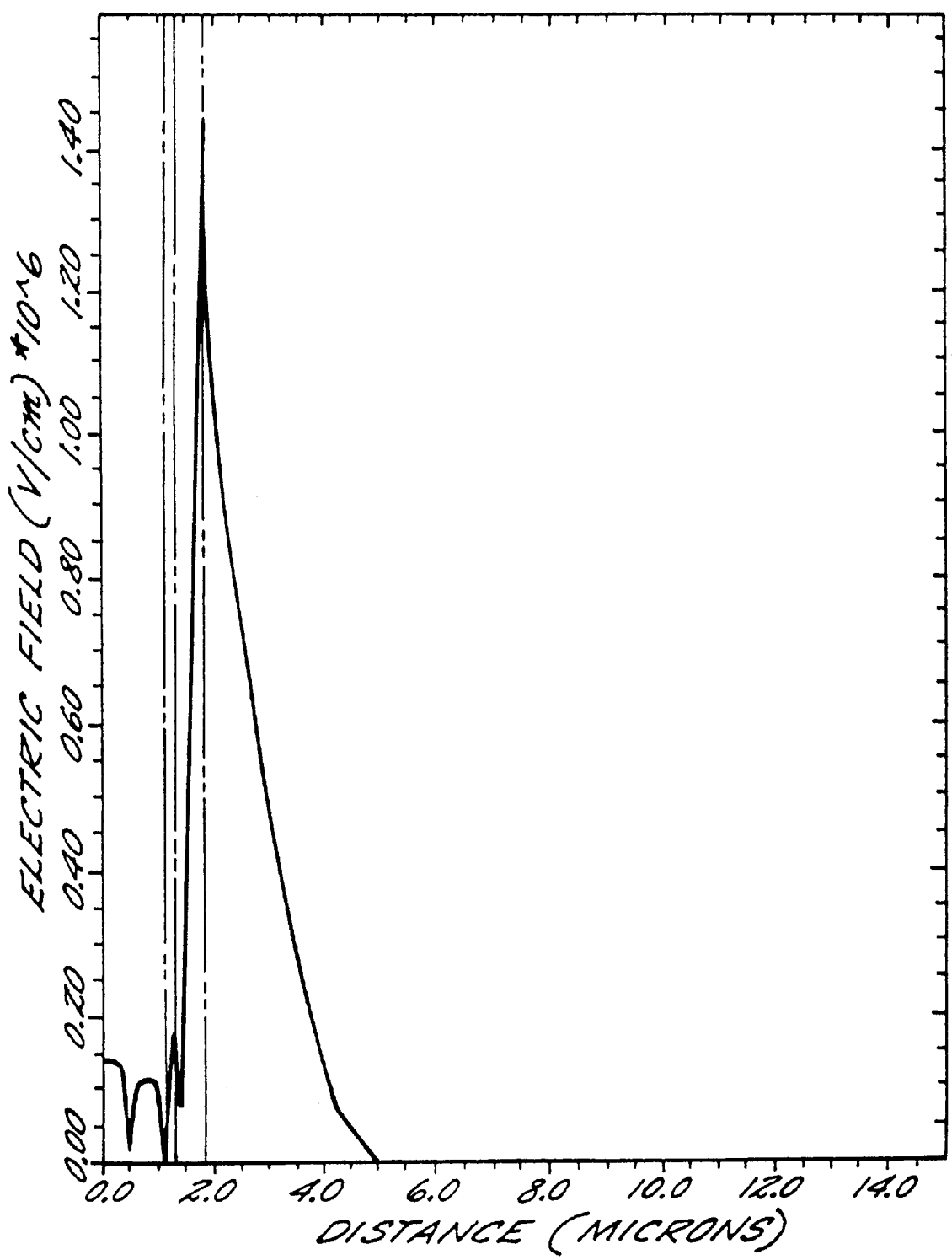

FIG. 10 plots the same information as FIG. 9, but again taken along the vertical line at x=3.0967. Thus, FIG. 10 corresponds in its geometry to FIG. 6. FIG. 10 shows two peaks. The largest of the two peaks falls at the coordinates x=3.1 and y=1.75 which, referring to FIG. 7, is adjacent the p-n junction.

FIG. 10 also shows that the oxide peak falls at the corner of the oxide (x=3.1 and y=1.2), but is again greatly reduced from the prior art device; i.e. about $0.18 \times 10^6$ V/cm.

Figure 11:
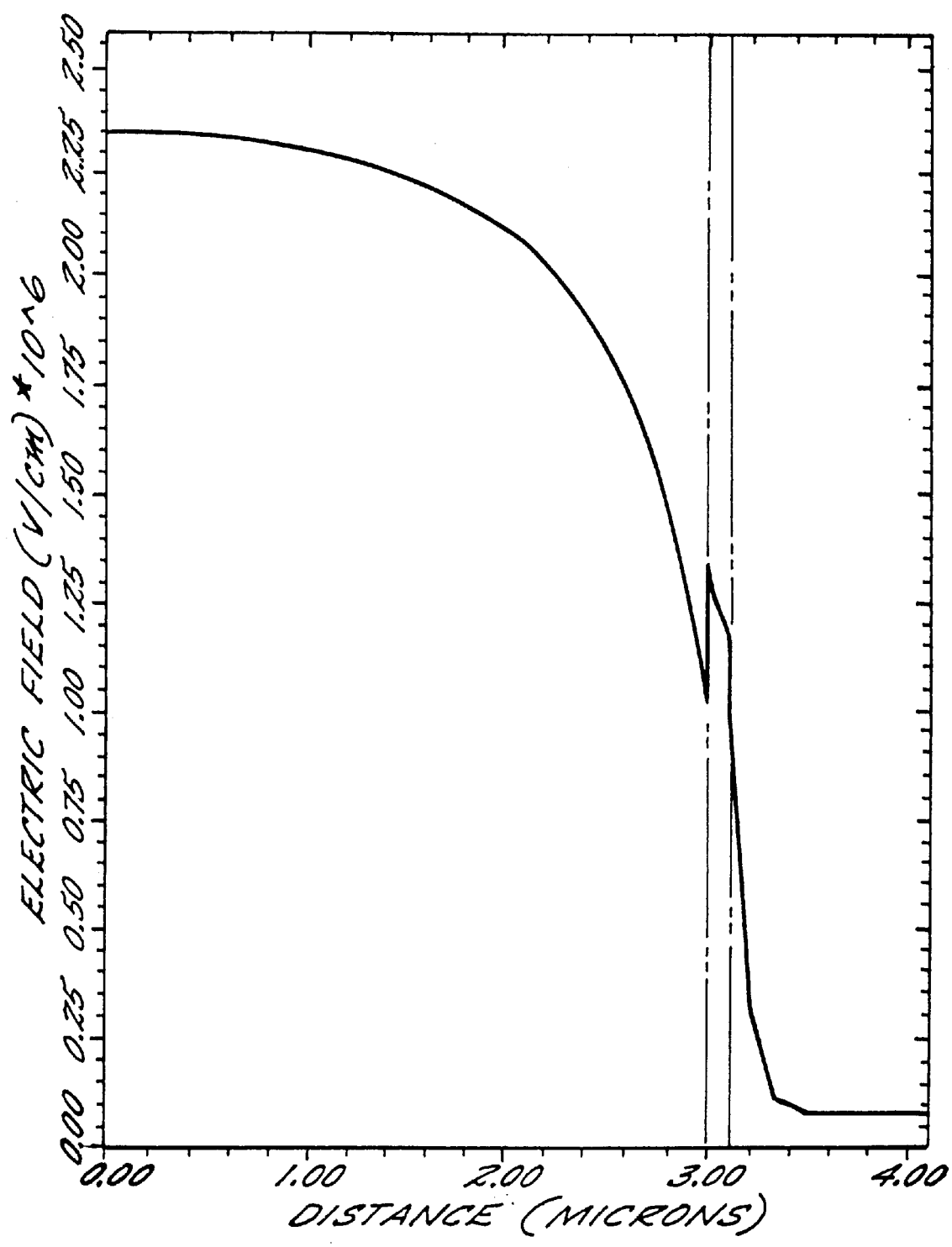
FIGS. 11 and 12 plot the same type of information as FIGS. 9 and 10, but at a higher applied voltage.

FIG. 11 plots the electric field along the same horizontal line (y=1.2033 microns) as in the other similar figures, but at an applied drain voltage of 950 volts in the structure of the invention. FIG. 11 also represents the same doping level (2E16) in the n⁻ layer as in FIGS. 9 and 10. Once again the peak electric field is at the corner of the oxide (x=3, y=1.2 microns) but is still relatively low; i.e. about $1.32 \times 10^6$ V/cm. Stated differently, even under an applied drain voltage of 950 volts, the structure of the present invention reduces the electric field at the corner of the oxide to a fraction of the electric field at the same position under far less voltage in conventional structures.

Figure 12:
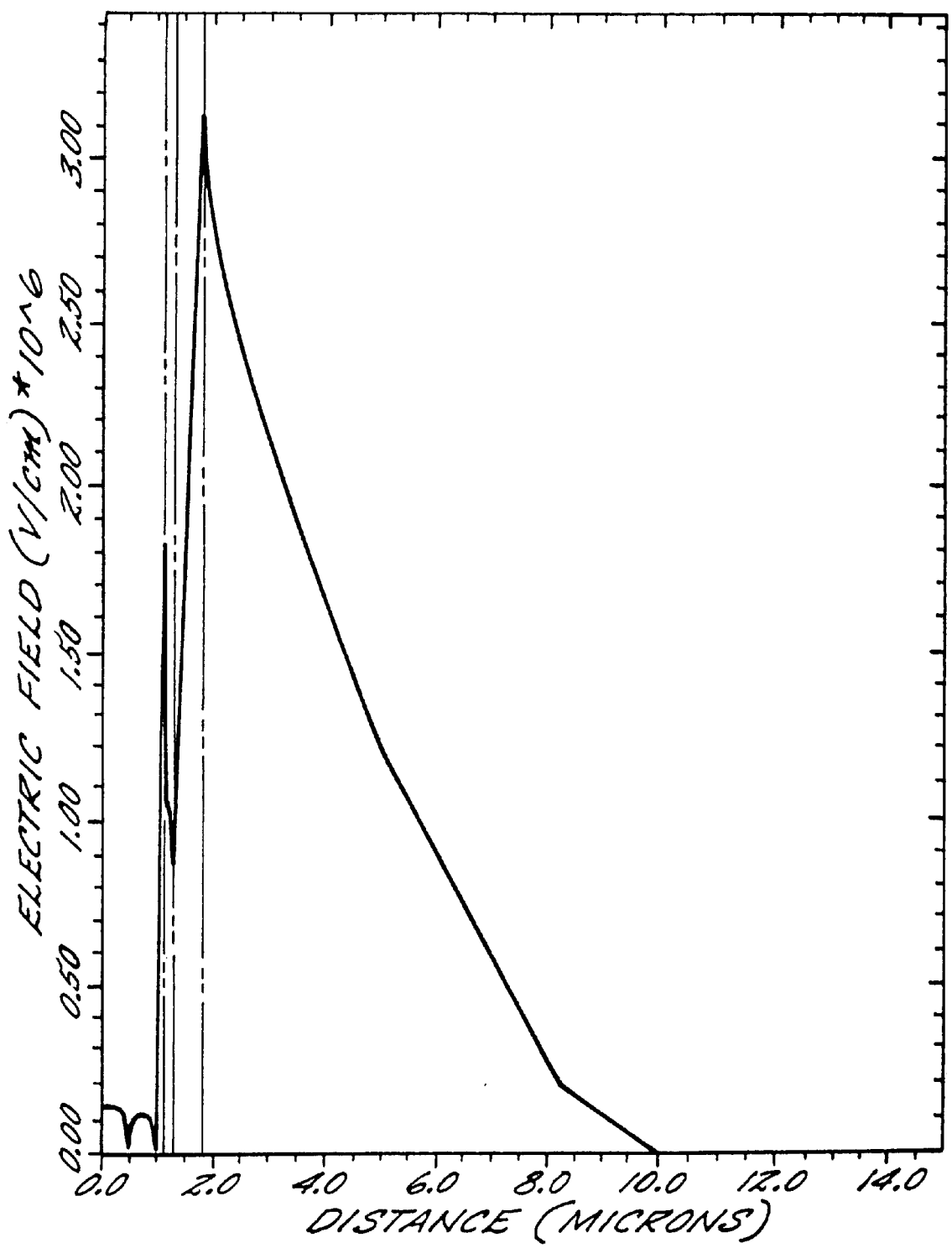

FIG. 12 corresponds to FIG. 11 in that it represents an applied drain voltage of 950 volts, but as in other similar plots, is taken along the vertical line x=3.0967 microns. FIG. 12 also includes two peaks. Again, the higher of the two peaks (at coordinates x=3.1 and y=1.9 microns represents the field at the p-n junction and, at a strength of approximately $3.12 \times 10^6$ V/cm, is approaching the breakdown field of silicon carbide at this doping level. The other peak again occurs at the corner of the oxide (x=3.1 microns, y=1.2 microns) and is about $1.82 \times 10^6$ V/cm, well within the desired field strength parameters.

Figure 13:
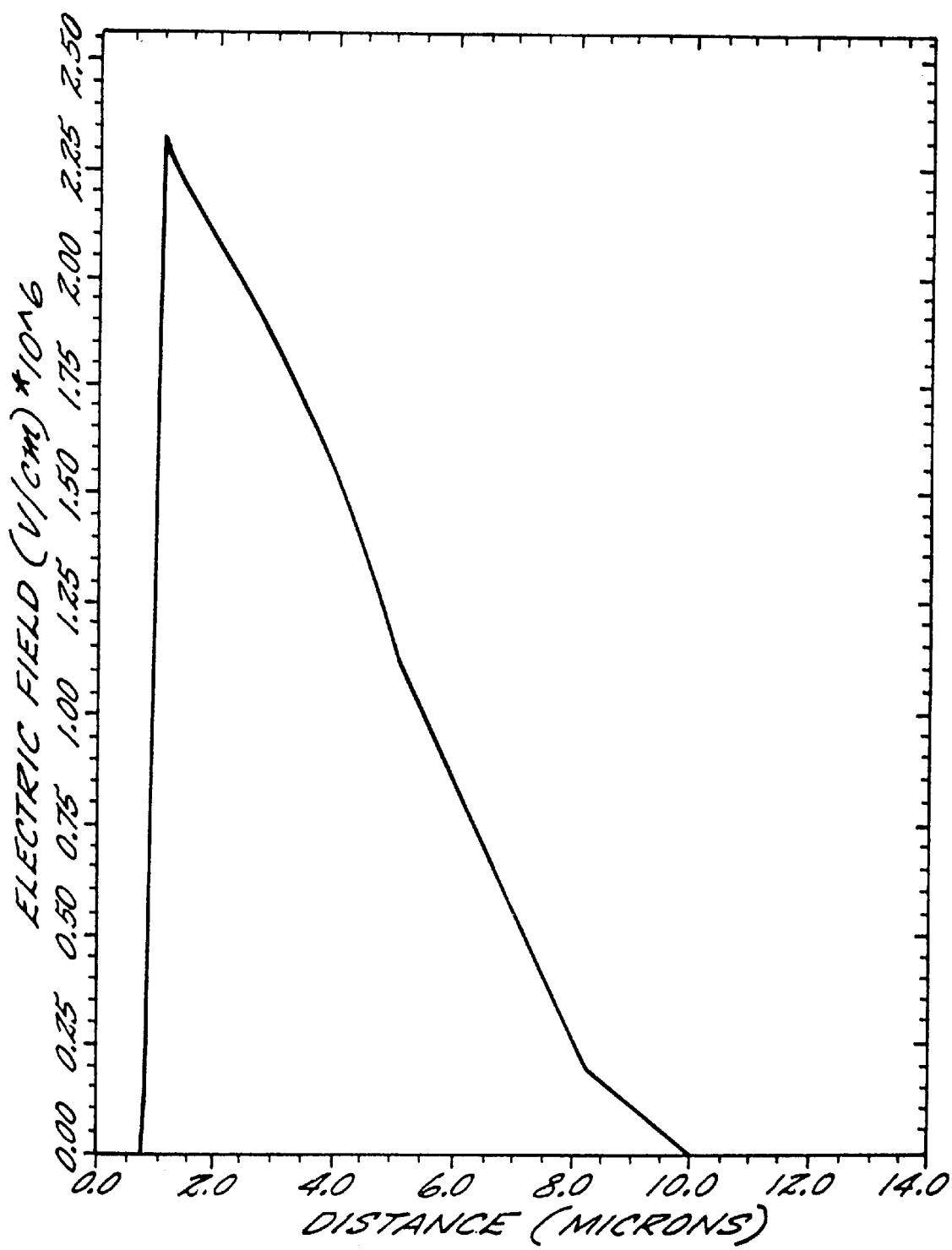
FIG. 13 is a plot under the same conditions as FIGS. 11 and 12, but along a different portion of the device.

FIG. 13 is taken along a slightly different vertical line (x=1.0536 microns) than the previous plots, but also represents 950 V applied to the drain and an n⁻ doping level of 2E16. This particular x coordinate represents a vertical slice of the structure of the invention that is somewhat removed from the oxide, and thus demonstrates the field strength through the p and n portions of the transistor and particularly the field at the p-n junction (x=1.0536, y=about 1.1 microns). FIG. 13 shows the peak field strength in the silicon carbide near the p-n junction to be on the order of about $2.33 \times 10^6$ V/cm, which is again within the desired limits.

As noted above, FIGS. 5 through 13 were all calculated at doping concentrations in the n⁻ layer of $2E16$ cm⁻³. Because of the effect of doping on breakdown voltage, the MEDICI™ program was again used to simulate the behavior of the structure of the invention at a reduced doping level of $2.5 \times 10^{15}$ cm⁻³ ("2.5E15") in the n⁻ layer. The grid is the same as that originally defined in FIGS. 7 and 8, and thus the coordinates of FIGS. 14–18 correspond to those in FIGS. 9–13.

Figure 14:
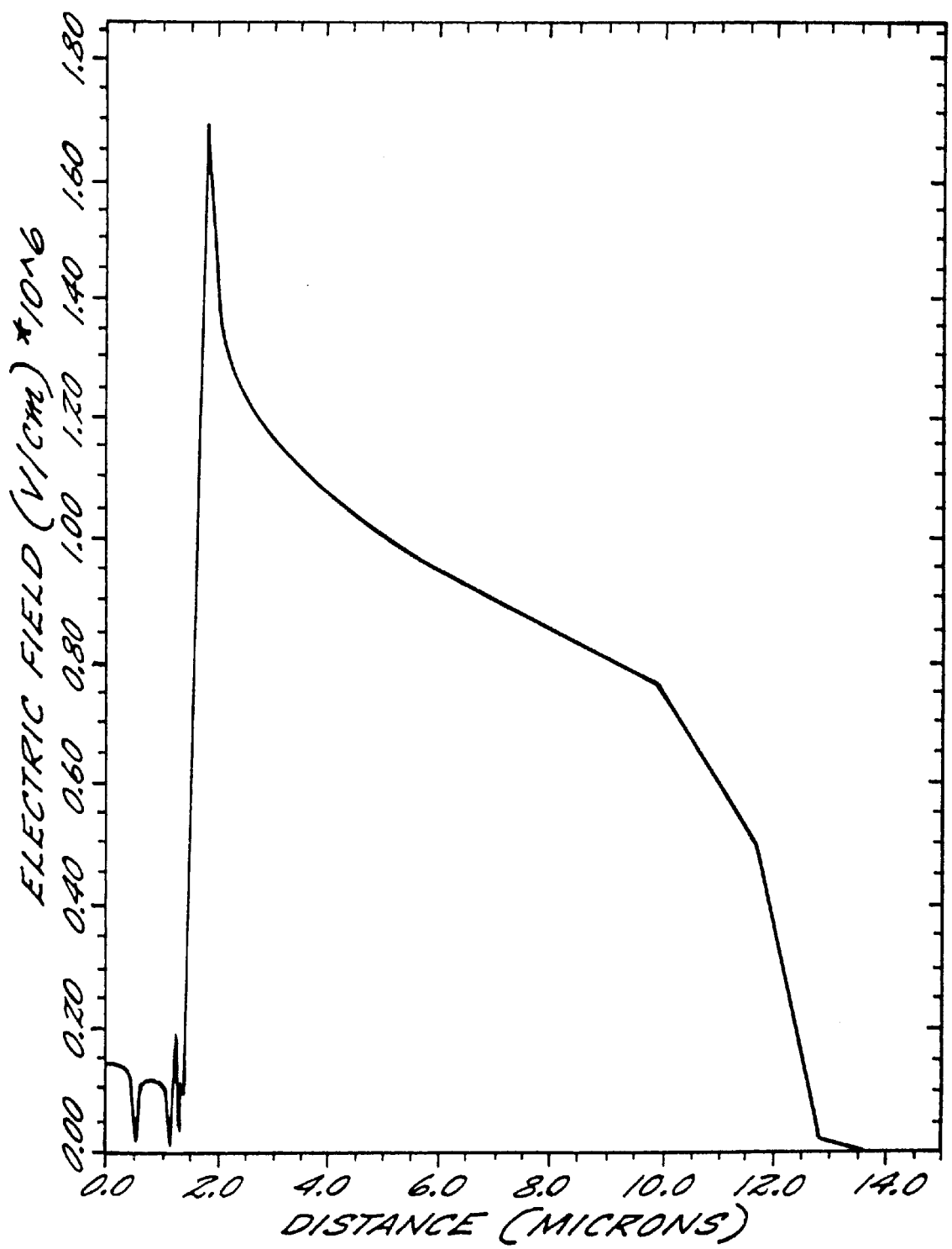
FIGS. 14 and 15 are plots similar to FIGS. 9–12, but taken at a lower doping level than the devices modeled in the previous figures.

FIG. 14 is another plot of the electric field taken along the vertical line at coordinate x=3.0967 microns, with an applied drain voltage of 950 volts at the lower doping level of $2.5E15$ cm⁻³. FIG. 14 includes two peaks that again respectively represent field strength at the oxide and the p-n junction. The field strength at the p-n junction (x=3.1 and y=1.95 microns) is about $1.69 \times 10^6$ V/cm, well within the desired limits. Similarly, the maximum field in the oxide (x=3.1 and y=1.25 microns) is about $0.19 \times 10^6$ V/cm, well under the maximum field of the corresponding prior art devices.

Figure 15:
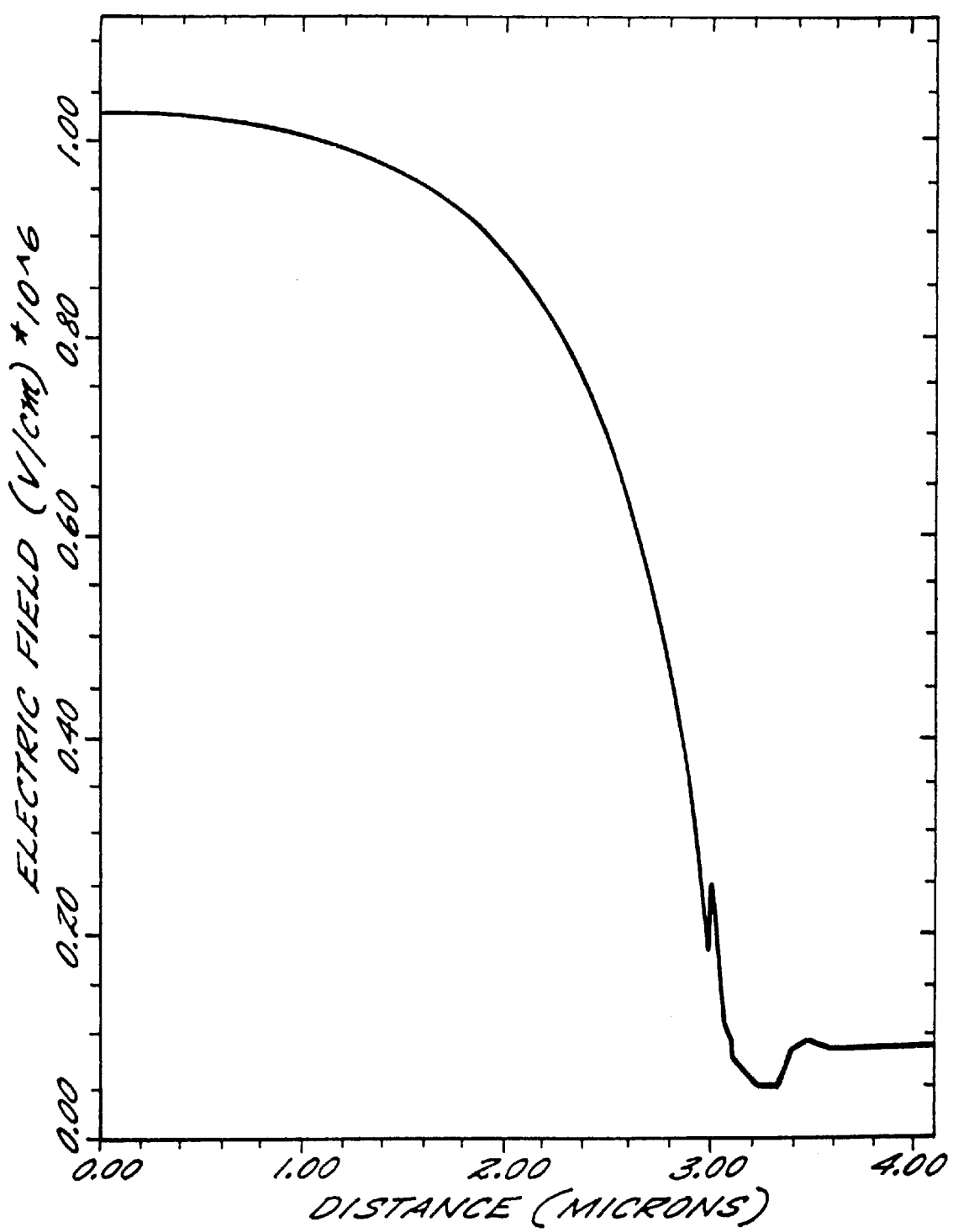

FIG. 15 corresponds to FIG. 14, but with the data plotted along the horizontal line y=1.2033 microns. Taken along this line, the peak field strength again occurs at the corner of the oxide (x=3 and y=1.2 microns) with a value of approximately $0.25 \times 10^6$ V/cm, once again well under the maximum field of the prior art devices.

Figure 16:
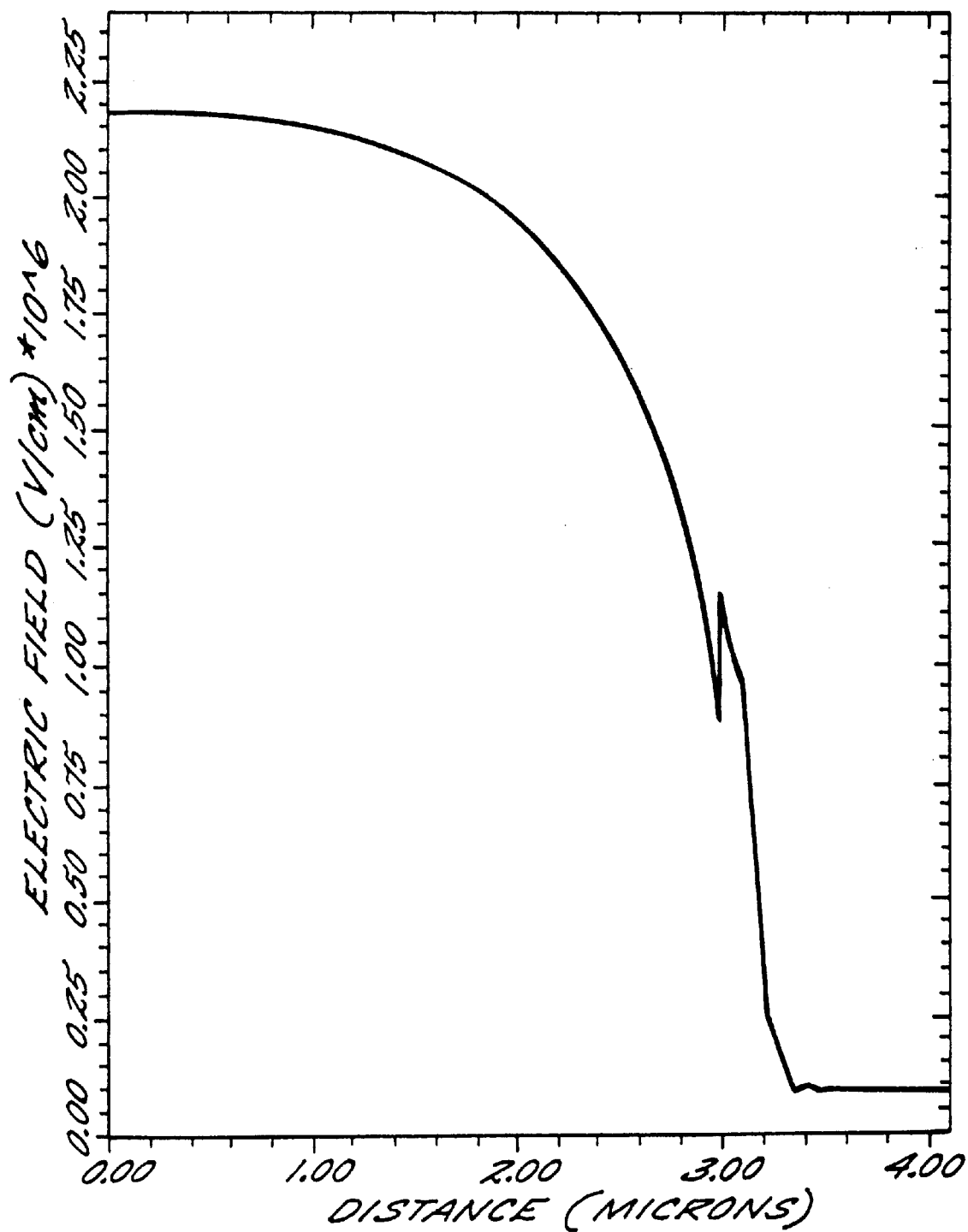
FIGS. 16–18 are similar plots for the lower doping levels of FIGS. 14 and 15, but under much higher applied drain voltages.
Figure 17:
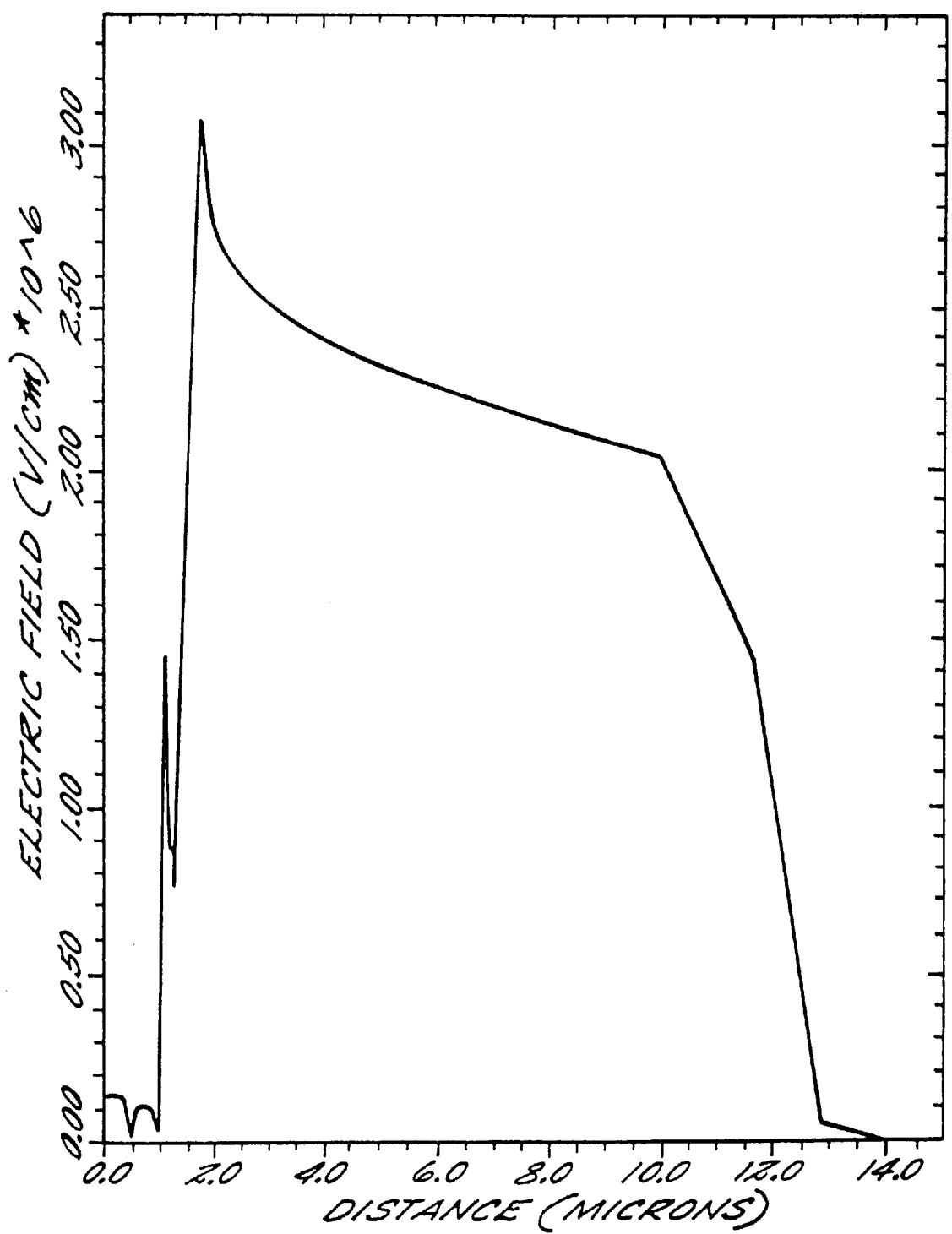

FIGS. 16 and 17 represent plots for the same doping levels as FIGS. 14 and 15, but at an applied drain voltage of 2300 volts. The peak field still falls at the corner of the oxide (x=3 and y=1.2 microns), and the field strength at that point is $1.15 \times 10^6$ V/cm; i.e. still only a fraction of the field strength experienced by conventional devices at much lower voltages.

FIG. 17 corresponds to FIG. 16, but is taken along the vertical line of x=3.0967 microns. As in the other plots taken along a vertical line, FIG. 17 shows two peaks, the higher of which represents the p-n junction (x=3.1 and y=1.8 microns). At the p-n junction the electric field reaches approximately $3.1 \times 10^6$ V/cm; i.e. closer to the breakdown voltage of the silicon carbide at this doping level. The peak field strength in the oxide, however, remains much lower, on the order of about $1.47 \times 10^6$ V/cm; i.e. a fraction of the field strength that would become problematic.

Figure 18:
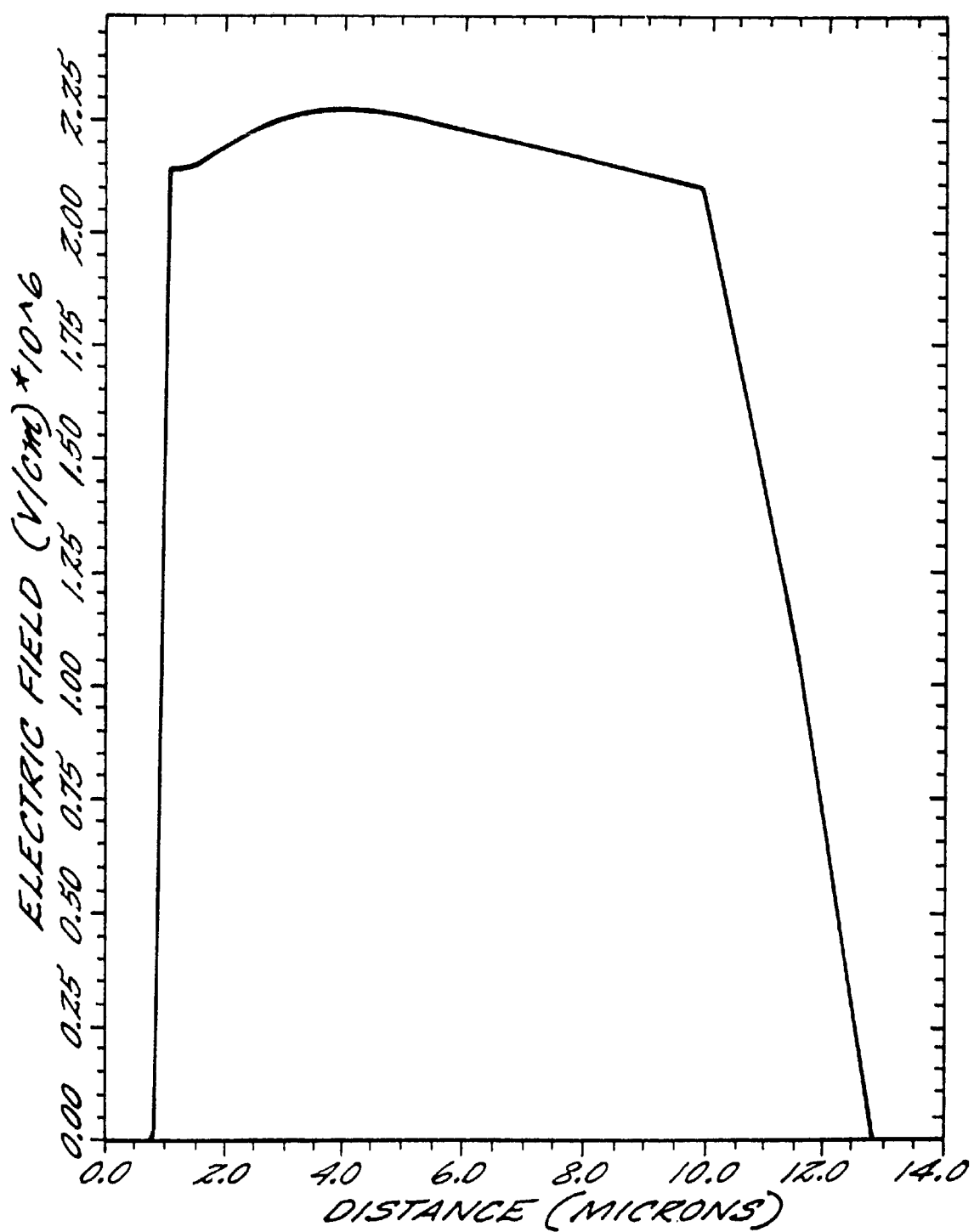

Finally, FIG. 18 corresponds to FIG. 13 (i.e. a vertical line at x-1.0536 microns), except at the lower doping level (2.5E15 cm⁻³ and the higher drain voltage (2300 volts). FIG. 18 demonstrates that along this vertical line, the field is strong throughout the p and n portions of the device and is closer to breakdown at all such points (i.e. always above about $2.10 \times 10^6$ V/cm).

In short summary, FIGS. 4 through 18 demonstrate that the UMOS of the present invention offers superior resistance to oxide degradation or breakdown at voltages that are both multiples and orders of magnitude higher than those at which conventional silicon carbide UMOS devices would experience breakdown.

As a proviso, the relatively close proximity of the p-type epitaxial layer of the transistor to the implanted p-type protective region can encourage a pinching effect that may reduce the on-current of the device. Accordingly, in preferred embodiments, the grounded p-type region is spaced sufficiently from the p-type epitaxial layer to minimize any such pinching effects. Studies are now under way to calculate and then design the optimum geometry of the two p-type regions and these are expected to produce useful results in the immediate future.

In another aspect, the invention comprises a method of making the insulated gate silicon carbide power transistors according to the present invention. In such aspect, the invention comprises etching a first-opposite-first conductivity-type silicon carbide structure to define a trench with a first-opposite-first conductivity-type wall, forming an opposite conductivity type layer at the bottom of the trench and aligned by the trench walls, forming the appropriate oxidation layer on the trench walls and trench bottom, and then adding respective ohmic contacts to form the source, gate, and drain (or emitter in an IGBT).

Accordingly, in producing the previously-described embodiments with the n-type source and drain, the method can further comprise growing a p-type epilayer on either an n-type epilayer or n-type substrate, followed by the step of forming an n-type well in the p-type epilayer. This produces an n-p-n SiC structure that can be etched to produce an n-p-n wall.

Epitaxy of SiC is normally accomplished by chemical vapor deposition (CVD). Both 4H and 6H-SiC wafers with customer-specified epilayers are commercially available. These layers can be nitrogen doped (n-type) or aluminum doped (p-type) at doping levels from $10^{14}$ cm⁻³ to $10^{20}$ cm⁻³.

Selective-area doping is accomplished by ion implantation. This is necessary because thermal diffusion coefficients in SiC are too small for diffusion of impurities to be practical. SiC can be implanted to greater than $10^{19}$ cm$^{-3}$ with nitrogen (n-type) and with either boron or aluminum (p-type). In preferred embodiments, the implantation is conducted with the wafer at an elevated temperature, and the implants are activated at 1200 to 1500° C. in argon. (Note that at 1500° C., a silicon wafer would melt). Such high temperature implantation is described in U.S. Pat. No. 5,087,576.

Anisotropic etching is by RIE. Any fluorinated gas can be used, including $NF_3$ and $SF_6$. Appropriate techniques for etching silicon carbide are set forth for example in U.S. Pat. Nos. 4,865,685 and 4,981,551. An early problem reported by several investigators was micromasking caused by aluminum particle contamination during RIE of SiC. This problem can be eliminated by adding a graphite cover plate over the aluminum cathode in the RIE chamber. Highly anisotropic profiles in 6H-SiC to a depth of tens of microns can accordingly be obtained. The surface morphology of the etched surfaces is good.

With respect to thermal oxidation, MOS oxides are critical elements of most semiconductor devices, particularly power devices. The important figures of merit are the interface state density DIT, the fixed charge density QF, and the breakdown field EBOX.

A difficulty exists in obtaining an accurate measurement of the interface state density DIT on SiC. Because of the wide bandgap of SiC, deeper-lying interface states at the SiO2/SiC interface are not in thermal equilibrium with the semiconductor at room temperature, and the occupancy of interface states cannot follow changes in the DC bias. To correctly measure the interface state density using CV techniques, it is necessary to heat the sample enough that the states can remain in quasi-steady-state as the gate voltage is changed. This has not been recognized by all SiC researchers, and several erroneous reports are present in the literature. A better approach appears to be a modified hi-lo capacitance technique and an AC conductance technique at elevated temperatures to characterize the SiO2/SiC interface.

Thick oxides are used for field and intermediate dielectrics and as passivation layers for field termination on high-voltage devices. It is not practical to grow thick oxides by conventional thermal oxidation due to the long times and temperatures involved. Moreover, dopant redistribution (segregation) into a growing thermal oxide can be a problem. Several other techniques are preferred, depending on the circumstances: (i) deposition of thick $SiO_2$ by either LPCVD or PECVD, (ii) deposition of an amorphous silicon layer which is later converted to $SiO_2$ by thermal oxidation, or (iii) application of spin-on-glass (SOG).

Ohmic contacts are formed to n- and p-type layers by annealed nickel and annealed aluminum, respectively. These procedures are quite routine, and specific contact resistivities in the $10^{-6}$ ohm-cm$^2$ range can be obtained to heavily-doped n-type SiC. Ohmic contacts to p-type material are more difficult, and contact resistivities range from $10^{-3}$ ohm-cm$^2$ for lightly-doped material to $10^{-5}$ ohm-cm$^2$ for heavily-doped material. Schottky contacts are easy to fabricate, and Fermi level pinning is not observed. As a result, barrier heights are a function of the metal, and a wide range of barrier heights are attainable. Typical metals used for Schottky contacts on SiC are Au, Pt, and Ti.

Metal and polysilicon deposition procedures are similar to silicon, and no unusual problems are generally encountered. Preferred techniques include boat-evaporated aluminum, molybdenum or LPCVD polysilicon as gate materials for SiC MOSFETs.

In another embodiment, the invention comprises an insulated gate bipolar transistor (IGBT). As known to those familiar with such devices, an IGBT has the high input impedance and high speed characteristics of a MOSFET with the conductivity characteristic—low saturation voltage—of a bipolar transistor. In its most typical application, the IGBT is turned on by applying a positive voltage between the source and the emitter, and as in a MOSFET is turned off by making the gate signal zero or slightly negative. An IGBT has a much lower on resistance than a corresponding MOSFET. Compared to a MOSFET, an IGBT is generally smaller with the same current rating, although the bipolar action in an IGBT slows down the device so that it exhibits a much lower frequency than a corresponding MOSFET. IGBTs are discussed in some detail in Dorf, *The Electrical Engineering Handbook* (1993); CRC Press at pages 699–700 and related devices such as the field/controlled thyristor are discussed in Sze, *Physics of Semiconductor Devices,* Second Edition, 1981 at pages 238–240. Accordingly, the structure and function of the IGBT will not be discussed in detail herein other than to illustrate this embodiment of the present invention.

In this embodiment, the invention comprises an insulated gate bipolar power transistor formed in silicon carbide with silicon dioxide as the gate insulator. The transistor includes a source with the first conductivity type, and a protective region beneath the gate oxide that has the opposite conductivity type from the source, for protecting the gate oxide from the degrading or breakdown effects of a large voltage applied across the transistor.

Figure 19:
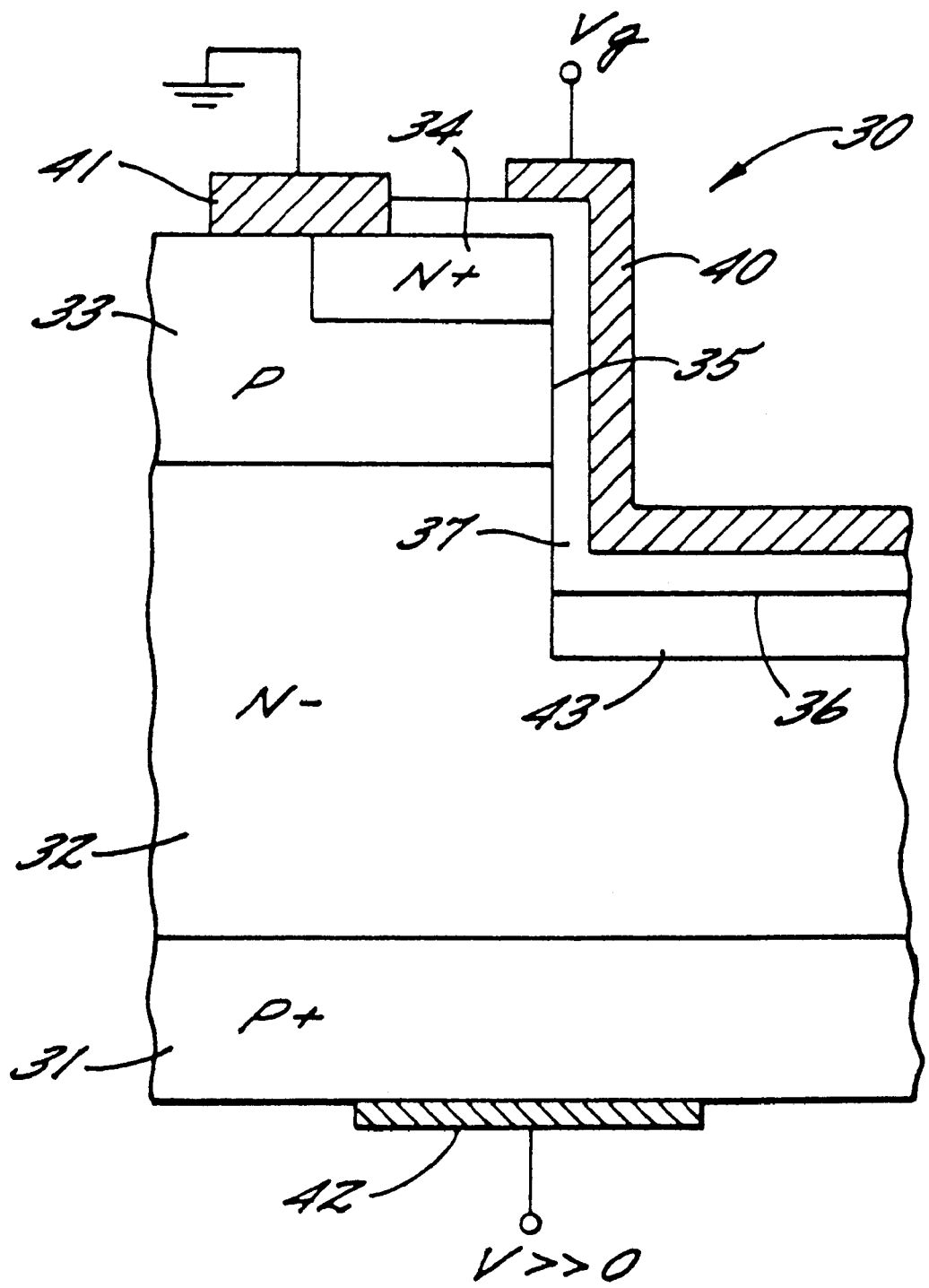
FIG. 19 is a schematic cross-sectional view of an insulated gate bipolar transistor (IGBT) according to the present invention.

An IGBT according to the present invention is illustrated in FIG. 19 and is broadly designated at 30. The IGBT 30 comprises a p-type silicon carbide substrate 31, an n-type silicon carbide epitaxial layer 32 on the p-type substrate 31, a p-type silicon carbide epitaxial layer 33 on the n-type n-type epitaxial layer 32, and an n-type well 34 in the p-type epitaxial layer 33. A gate trench illustrated by its wall 35 and bottom 36 extend through the n-type well 34 and the p-type epitaxial layer 33 and terminates in the n-type substrate 32. A gate oxide 37 is on the wall 35 and bottom 36 of the trench. Respective ohmic contacts 40, 41, and 42 to the gate oxide 37 to the n-type well 34 and to p-type substrate 31 define the gate, the source, and the emitter.

As in the other embodiments, the IGBT 30 includes a p-type silicon carbide region 43 between the gate oxide 37 and the n-type epitaxial layer 32 and aligned with the bottom 36 of the gate trench for protecting the oxide 37 in the trench from the degrading or breakdown effects of a large positive voltage applied across the transistor 30.

In preferred embodiment, the p-type region is grounded and is formed by implantation as discussed previously. Similarly, and as in the MOSFET embodiments of the invention, the p-type region 43 is spaced sufficiently from the p-type epitaxial layer 33 to minimize any current pinching effects between the p-type region 43 and the p-type epitaxial layer 33.

As in the earlier embodiments, the ohmic contacts to the n-type regions are selected from the group consisting of nickel and nickel alloys, while the ohmic contacts to the p-type material are preferably selected from the group consisting of aluminum, aluminum alloys, and cobalt silicide.

As in the previous embodiments, nitrogen is typically preferred for doping the n-type material, while the p-type material is typically doped with either aluminum or boron. As in the earlier embodiments, the silicon carbide in the transistor 30 has a polytype selected from the group consisting of 4H and 6H.

In the drawings and specification, there have been disclosed typically preferred embodiments of the invention, and although specific terms have been employed, they have been used in a generic sense and descriptive sense only, and not for purposes of limitation, the scope of the invention being set forth in the following claims:

That which is claimed:

1. A silicon carbide UMOS power transistor that demonstrates increased maximum voltage, said transistor comprising:

a metal oxide semiconductor, enhancement-type field effect transistor formed in silicon carbide and including a trench and a trench oxide on the walls and bottom of said trench;

said transistor having a source and a drain wherein both said source and said drain have the same conductivity type, said transistor further having a channel region with the opposite conductivity type from said source and said drain; and an implanted protective region aligned beneath said trench oxide of said transistor that is directly grounded for protecting said trench oxide from the degrading or breakdown effects of a large voltage applied to the drain; said implanted protective region being n-type when said source and drain are p-type and being p-type when said source and drain are n-type.

2. A silicon carbide UMOS power transistor that demonstrates increased maximum voltage, said transistor comprising:

an n-type silicon carbide substrate;

a p-type silicon carbide epitaxial layer on said n-type substrate;

an n-type well in said p-type epitaxial layer;

a gate trench extending through said n-type well and said p-type epitaxial layer and terminating in said n-type substrate;

a gate oxide on the walls and bottom of said trench;

respective ohmic contacts to said gate oxide for defining a gate, to said n-type well for defining a source, and to said substrate for defining a drain; and a p-type silicon carbide region between said oxide and said n-type substrate that is directly grounded and aligned with the bottom of said gate trench for protecting said oxide in said trench from the degrading or breakdown effects of a large positive voltage applied to the drain.

3. A silicon carbide UMOS power transistor according to claim 2 wherein said p-type region is a grounded region.

4. A silicon carbide UMOS power transistor according to claim 2 wherein said p-type region is an implanted region.

5. A silicon carbide UMOS power transistor according to claim 2 wherein said p-type region is spaced sufficiently from said p-type epitaxial layer to minimize any current pinching effects between said p-type region and said p-type epitaxial layer.

6. A silicon carbide UMOS power transistor according to claim 2 wherein said ohmic contacts to said n-type well and said n-type substrate are selected from the group consisting of nickel and nickel alloys.

7. A silicon carbide UMOS power transistor according to claim 3 wherein said grounded p-type region is grounded through an ohmic contact selected from the group consisting of aluminum, aluminum alloys, and cobalt silicide.

8. A silicon carbide UMOS power transistor according to claim 2 wherein said n-type well and said n-type substrate are both doped with nitrogen, and wherein the dopant for said p-type epitaxial layer is selected from the group consisting of aluminum and boron.

9. A silicon carbide UMOS power transistor according to claim 2 wherein the silicon carbide has a polytype selected from the group consisting of 4H and 6H.

10. A silicon carbide UMOS power transistor according to claim 2 wherein said n-type substrate has a carrier concentration of about $2 \times 10^{16}$ cm$^{-3}$; said p-type epitaxial layer has a carrier concentration of about $5 \times 10^{17}$ cm$^{-3}$; and said p-type region beneath said oxide has a carrier concentration of about $5 \times 10^{17}$ cm$^{-3}$.

11. A silicon carbide UMOS power transistor that demonstrates increased maximum voltage, said transistor comprising:

an n-type silicon carbide substrate;

an n-type silicon carbide epitaxial layer on said n-type substrate;

a p-type epitaxial layer on said n-type epitaxial layer;

an n-type well in said p-type epitaxial layer;

a gate trench extending through said n-type well and said p-type epitaxial layer and terminating in said n-type epitaxial layer;

a gate oxide on the walls and bottom of said trench;

respective ohmic contacts to said gate oxide for defining a gate, to said n-type well for defining a source, and to said substrate for defining a drain; and a p-type region between said oxide and said n-type epitaxial layer that is directly grounded and aligned with the bottom of said gate trench for protecting said oxide in said trench from the degrading or breakdown effects of a large positive voltage applied to the drain.

12. A silicon carbide UMOS power transistor according to claim 11 wherein said p-type region is a grounded region.

13. A silicon carbide UMOS power transistor according to claim 11 wherein said n-type substrate is more heavily doped than said n-type epitaxial layer.

14. A silicon carbide UMOS power transistor according to claim 11 wherein said n-type substrate has a carrier concentration of about $2 \times 10^{19}$ cm$^{-3}$ and said n-type epitaxial layer has a carrier concentration of between about $2.5 \times 10^{15}$ cm$^{-3}$ and $2 \times 10^{16}$ cm$^{-3}$.

15. A silicon carbide UMOS power transistor according to claim 11 wherein the silicon carbide has a polytype selected from the group consisting of 4H and 6H.

16. A silicon carbide UMOS power transistor according to claim 11 wherein said p-type epitaxial layer has a carrier concentration of about $5 \times 10^{17}$ cm$^{-3}$; and said p-type region has a carrier concentration of about $5 \times 10^{17}$ cm$^{-3}$.

17. A silicon carbide UMOS power transistor according to claim 11 wherein said p-type region is an implanted region.

18. A silicon carbide UMOS power transistor according to claim 11 wherein the dopant for said p-type region is selected from the group consisting of aluminum and boron.

19. A silicon carbide UMOS power transistor according to claim 11 wherein said p-type region is spaced sufficiently from said p-type epitaxial layer to minimize any current pinching effects between said p-type region and said p-type epitaxial layer.

20. A silicon carbide UMOS power transistor according to claim 11 wherein said ohmic contacts to said n-type well and said n-type substrate are selected from the group consisting of nickel and nickel alloys.

21. A silicon carbide UMOS power transistor according to claim 12 wherein said grounded p-type region is grounded through an ohmic contact selected from the group consisting of aluminum, aluminum alloys and cobalt silicide.

22. A silicon carbide UMOS power transistor according to claim 11 wherein said n-type well, said n-type epitaxial layer, and said n-type substrate are all doped with nitrogen.

23. A silicon carbide UMOS power transistor according to claim 11 wherein said p-type epitaxial layer is doped with aluminum.

24. A silicon carbide insulated gate bipolar power transistor (IGBT) that demonstrates increased maximum voltage, said transistor comprising:

a p-type silicon carbide substrate;

an n-type silicon carbide epitaxial layer on said p-type substrate;

a p-type silicon carbide epitaxial layer on said n-type epitaxial layer;

an n-type well in said p-type epitaxial layer;

a gate trench extending through said n-type well and said p-type epitaxial layer and terminating in said n-type substrate;

a gate oxide on the walls and bottom of said trench;

respective ohmic contacts to said gate oxide for defining a gate, to said n-type well for defining a source, and to said substrate for defining an emitter; and a p-type silicon carbide region between said oxide and said n-type epitaxial layer that is directly grounded and aligned with the bottom of said gate trench for protecting said oxide in said trench from the degrading or breakdown effects of a large positive voltage applied across said transistor.

25. A silicon carbide IGBT power transistor according to claim 24 wherein said p-type region is a grounded region.

26. A silicon carbide IGBT power transistor according to claim 24 wherein said p-type region is an implanted region.

27. A silicon carbide IGBT power transistor according to claim 24 wherein said p-type region is spaced sufficiently from said p-type epitaxial layer to minimize any current pinching effects between said p-type region and said p-type epitaxial layer.

28. A silicon carbide IGBT power transistor according to claim 24 wherein said ohmic contacts to said n-type well and said n-type substrate are selected from the group consisting of nickel and nickel alloys.

29. A silicon carbide IGBT power transistor according to claim 25 wherein said grounded p-type region is grounded through an ohmic contact selected from the group consisting of aluminum, aluminum alloys, and cobalt silicide.

30. A silicon carbide IGBT power transistor according to claim 24 wherein said n-type well and said n-type substrate are both doped with nitrogen, and wherein the dopant for said p-type epitaxial layer is selected from the group consisting of aluminum and boron.

31. A silicon carbide IGBT power transistor according to claim 24 wherein the silicon carbide has a polytype selected from the group consisting of 4H and 6H.

* * * * *

UNITED STATES PATENT AND TRADEMARK OFFICE
CERTIFICATE OF CORRECTION

PATENT NO.   : 6,180,958 B1
DATED        : January 30, 2001
INVENTOR(S)  : James A. Cooper, Jr.

It is certified that error appears in the above-identified patent and that said Letters Patent is hereby corrected as shown below:

<u>Column 1,</u>
Line 6, insert -- The present invention was made with support from the Office of Naval Research, Contract No. N00014-95-1302. The government may have certain rights in this invention. --

Signed and Sealed this

First Day of January, 2002

*Attest:*

*Attesting Officer*

JAMES E. ROGAN
*Director of the United States Patent and Trademark Office*